(12) United States Patent
Groeschel et al.

(10) Patent No.: US 9,990,935 B2
(45) Date of Patent: Jun. 5, 2018

(54) SYSTEM ASPECTS OF AN AUDIO CODEC

(71) Applicants: DOLBY LABORATORIES LICENSING CORPORATION, San Francisco, CA (US); DOLBY INTERNATIONAL AB, Amsterdam Zuidoost (NL)

(72) Inventors: Alexander Groeschel, Nuremberg (DE); Jens Popp, Nuremberg (DE); Martin Wolters, Nuremberg (DE); Jeffrey Riedmiller, San Francisco, CA (US); Michael Ward, San Francisco, CA (US); Karl Jonas Roeden, Stockholm (SE); Holger Hoerich, Nuremberg (DE); Karsten Linzmeier, Nuremberg (DE); Tobias Friedrich, Nuremburg (DE)

(73) Assignees: Dolby Laboratories Licensing Corporation, San Francisco, CA (US); Dolby International AB, Amsterdam (NL)

( * ) Notice: Subject to any disclaimer, the term of this patent is extended or adjusted under 35 U.S.C. 154(b) by 40 days.

(21) Appl. No.: 14/916,545

(22) PCT Filed: Sep. 10, 2014

(86) PCT No.: PCT/US2014/054899
§ 371 (c)(1),
(2) Date: Mar. 3, 2016

(87) PCT Pub. No.: WO2015/038578
PCT Pub. Date: Mar. 19, 2015

(65) Prior Publication Data
US 2016/0196831 A1    Jul. 7, 2016

Related U.S. Application Data

(60) Provisional application No. 61/985,879, filed on Apr. 29, 2014, provisional application No. 61/877,155, filed on Sep. 12, 2013.

(51) Int. Cl.
*G06F 17/00* (2006.01)
*G10L 19/24* (2013.01)
(Continued)

(52) U.S. Cl.
CPC ............ *G10L 19/24* (2013.01); *G10L 19/005* (2013.01); *G10L 19/008* (2013.01);
(Continued)

(58) Field of Classification Search
CPC ..... G10L 19/24; G10L 19/005; G10L 19/008; G10L 19/167; G10L 25/18;
(Continued)

(56) References Cited

U.S. PATENT DOCUMENTS 3,806,709 A   4/1974 Fitch
4,020,332 A   4/1977 Crochiere
(Continued)

FOREIGN PATENT DOCUMENTS

CN   101479785   7/2009
CN   101490745   7/2009
(Continued)

OTHER PUBLICATIONS

Polyphase Resampling URL:http://software.intel.com/sites/products/documentation/hpc/ipp/ipps/ipps_ch8/ch8_polyphase_resampling.
(Continued)

*Primary Examiner* — Fan Tsang
*Assistant Examiner* — David Siegel

(57) ABSTRACT

The present document relates to the design of anti-aliasing and/or anti-imaging filters for resamplers using rational resampling factors. In particular, the present document relates to a method for implementing such anti-aliasing and/or anti-imaging filters with reduced computational complexity. In addition, the present document relates to further
(Continued)

aspects of an audio encoding and decoding system, such as the phase relation between the channels of a multi-channel audio signal and/or the structure of the bitstream of an encoded audio signal.

20 Claims, 6 Drawing Sheets

(51) Int. Cl.
*G10L 19/008* (2013.01)
*H03H 17/02* (2006.01)
*H03H 17/04* (2006.01)
*H04S 3/02* (2006.01)
*G10L 19/16* (2013.01)
*G10L 25/18* (2013.01)
*G10L 19/005* (2013.01)

(52) U.S. Cl.
CPC ............ *G10L 19/167* (2013.01); *G10L 25/18* (2013.01); *H03H 17/0275* (2013.01); *H03H 17/0277* (2013.01); *H03H 17/0455* (2013.01); *H04S 3/02* (2013.01); *H04S 2400/03* (2013.01); *H04S 2400/05* (2013.01)

(58) Field of Classification Search
CPC ........... H03H 17/0275; H03H 17/0277; H03H 17/0455; H04S 3/02; H04S 2400/03; H04S 2400/05
See application file for complete search history.

(56) References Cited

U.S. PATENT DOCUMENTS

| | | | |
|---|---|---|---|
| 5,610,595 A | 3/1997 | Garrabrant | |
| 5,708,688 A | 1/1998 | Ting | |
| 5,790,538 A | 8/1998 | Sugar | |
| 6,008,847 A | 12/1999 | Bauchspies | |
| 6,014,682 A | 1/2000 | Stephen | |
| 6,349,284 B1 | 2/2002 | Park | |
| 6,480,535 B1* | 11/2002 | Witmayer | H03H 17/0275 375/232 |
| 6,678,332 B1 | 1/2004 | Gardere | |
| 6,806,909 B1 | 10/2004 | Radha | |
| 6,925,523 B2 | 8/2005 | Engel | |
| 6,961,395 B2 | 11/2005 | Fuller | |
| 7,424,377 B2 | 9/2008 | Hamilton | |
| 7,508,327 B2 | 3/2009 | Wang | |
| 7,525,526 B2 | 4/2009 | Brown Elliott et al. | |
| 7,542,899 B2 | 6/2009 | Etter | |
| 7,551,837 B2 | 6/2009 | Duffield | |
| 7,719,446 B2 | 5/2010 | Rosenthal | |
| 7,859,435 B2 | 12/2010 | Ferchland | |
| 7,920,078 B2 | 4/2011 | Jonsson | |
| 8,253,610 B2 | 8/2012 | Jonsson | |
| 2004/0230652 A1 | 11/2004 | Estrada | |
| 2006/0103555 A1 | 5/2006 | Antonesei | |
| 2009/0307294 A1 | 12/2009 | Picard | |
| 2010/0100389 A1 | 4/2010 | Stoner | |
| 2010/0103000 A1 | 4/2010 | Ferchland | |
| 2012/0041995 A1 | 2/2012 | Laporte | |
| 2012/0066280 A1* | 3/2012 | Tsutsui | H03H 17/028 708/300 |
| 2013/0170531 A1 | 7/2013 | Adut | |

FOREIGN PATENT DOCUMENTS

| | | |
|---|---|---|
| EP | 1125363 | 4/2004 |
| JP | 52-040012 | 3/1977 |
| JP | 08-046484 | 2/1996 |
| JP | 2000-125295 | 4/2000 |
| JP | 2003-298397 | 10/2003 |
| WO | 00/24122 | 4/2000 |
| WO | 2004/072956 | 8/2004 |
| WO | 2007/029633 | 3/2009 |
| WO | 2009/084920 | 7/2009 |
| WO | 2009/142465 | 4/2010 |
| WO | 2010/097748 | 9/2010 |
| WO | 2010/115850 | 10/2010 |
| WO | 2012/039920 | 3/2012 |
| WO | 2012/138819 | 10/2012 |

OTHER PUBLICATIONS

Cassaniti, Dario "A Multi-Hop 6LoWPAN Wireless Sensor Network for Waste Management Optimization" published in 2011/2012, pp. 1-164, Universita Degli Studi Padova, Facolta di Ingegneria.

Proakis, J. et al "Introduction to Digital Signal Processing" MacMillan Publishing Company, Jan. 1, 1993, pp. 660-671.

* cited by examiner

|   | a | b | c | d | e | f | g | h | i | filter coeffs | |
|---|---|---|---|---|---|---|---|---|---|---|---|
|   | 1 | 2 | 3 | 1 | 2 | 3 | 1 | 2 | 3 | phase index | |
|   | IN | | | | | | | | | OUT | |
| » | 1 | 0 | 0 | 0 | 0 | 0 | 0 | 0 | 0 | 1 | « |
| 204 | 0 | 1 | 0 | 0 | 0 | 0 | 0 | 0 | 0 | 0 | |
|   | 0 | 0 | 1 | 0 | 0 | 0 | 0 | 0 | 0 | 2 | « |
| » | 2 | 0 | 0 | 1 | 0 | 0 | 0 | 0 | 0 | 0 | |
|   | 0 | 2 | 0 | 0 | 1 | 0 | 0 | 0 | 0 | 3 | « |
|   | 0 | 0 | 2 | 0 | 0 | 1 | 0 | 0 | 0 | 0 | |
| » | 3 | 0 | 0 | 2 | 0 | 0 | 1 | 0 | 0 | 4 | « |
|   | 0 | 3 | 0 | 0 | 2 | 0 | 0 | 1 | 0 | 0 | |
|   | 0 | 0 | 3 | 0 | 0 | 2 | 0 | 0 | 1 | 5 | « |
| » | 4 | 0 | 0 | 3 | 0 | 0 | 2 | 0 | 0 | 0 | |
|   | 0 | 4 | 0 | 0 | 3 | 0 | 0 | 2 | 0 | 6 | « |
|   | 0 | 0 | 4 | 0 | 0 | 3 | 0 | 0 | 2 | 0 | |
| » | 5 | 0 | 0 | 4 | 0 | 0 | 3 | 0 | 0 | 7 | « |
|   | 0 | 5 | 0 | 0 | 4 | 0 | 0 | 3 | 0 | 0 | |
|   | 0 | 0 | 5 | 0 | 0 | 4 | 0 | 0 | 3 | 8 | « |
| » | 6 | 0 | 0 | 5 | 0 | 0 | 4 | 0 | 0 | 0 | |
|   | 0 | 6 | 0 | 0 | 5 | 0 | 0 | 4 | 0 | 9 | « |
|   | 0 | 0 | 6 | 0 | 0 | 5 | 0 | 0 | 4 | 0 | |
| » | 7 | 0 | 0 | 6 | 0 | 0 | 5 | 0 | 0 | 10 | « |
|   | 0 | 7 | 0 | 0 | 6 | 0 | 0 | 5 | 0 | 0 | |
|   | 0 | 0 | 7 | 0 | 0 | 6 | 0 | 0 | 5 | 11 | « |
| » | 8 | 0 | 0 | 7 | 0 | 0 | 6 | 0 | 0 | 0 | |
|   | 0 | 8 | 0 | 0 | 7 | 0 | 0 | 6 | 0 | 12 | « |
|   | 0 | 0 | 8 | 0 | 0 | 7 | 0 | 0 | 6 | 0 | |
| » | 9 | 0 | 0 | 8 | 0 | 0 | 7 | 0 | 0 | 13 | « |
|   | 0 | 9 | 0 | 0 | 8 | 0 | 0 | 7 | 0 | 0 | |
|   | 0 | 0 | 9 | 0 | 0 | 8 | 0 | 0 | 7 | 14 | « |
| » | 10 | 0 | 0 | 9 | 0 | 0 | 8 | 0 | 0 | 0 | |

SYSTEM ASPECTS OF AN AUDIO CODEC

CROSS-REFERENCE TO RELATED APPLICATIONS

This application claims the benefit of priority to U.S. Provisional Patent Application No. 61/877,155 filed 12 Sep. 2013 and U.S. Provisional Patent Application No. 61/985,879 filed 29 Apr. 2014, each of which is hereby incorporated by reference in its entirety.

TECHNICAL FIELD OF THE INVENTION

The present document relates to the design of anti-aliasing and/or anti-imaging filters for resamplers using rational resampling factors. In particular, the present document relates to a method for implementing such anti-aliasing and/or anti-imaging filters with reduced computational complexity. In addition, the present document relates to further aspects of an audio encoding and decoding system, such as the phase relation between the channels of a multi-channel audio signal and/or the structure of the bitstream of an encoded audio signal.

Furthermore, the present document relates to the modification of the frame rate of the bitstream of an encoded audio signal.

BACKGROUND OF THE INVENTION

Different audio formats may require different sampling rates (e.g. 32 kHz, 44.1 kHz or 48 kHz). In order to transfer an audio signal at a first sampling rate (e.g. at 32 kHz) to an audio signal at a second sampling rate (e.g. at 48 kHz) rational resamplers may be used. The resampling of audio by rational factors typically introduces imaging/aliasing artifacts into the resampled audio signal. An anti-imaging/anti-aliasing filter may be used to suppress the unwanted images and/or aliases of the audio signal. The present document describes anti-imaging/anti-aliasing filters used in rational resamplers. In particular, the present document describes a method for implementing such anti-imaging/anti-aliasing filters in a computationally efficient manner.

Furthermore, the frame rate of an encoded audio signal may be modified, e.g. in conjunction with a modification of the frame rate of an associated video signal. Such frame rates may be rational numbers. The present document describes methods and systems which are configured to enable the modification of the frame rate of an encoded audio signal with reduced (e.g. no) audible artifacts.

SUMMARY OF THE INVENTION

According to an aspect a system for resampling an input audio signal into an output audio signal is described. The system may also be referred to as a resampler. The system may be configured to perform a resampling in accordance to a rational resampling ratio. The resampling ratio L/M may be defined by an upsampling factor L, e.g. L being an integer greater or equal to one, and a downsampling factor M, e.g. M being an integer greater or equal to one. As such, the resampler may be configured to resample the input audio signal at an input sampling rate into the output audio signal at an output sampling rate, wherein the output sampling rate corresponds to L/M times the input sampling rate.

The system may comprise a processing unit which is configured to determine a current output sample of the output audio signal from one or more input samples of the input audio signal using a current subset of filter coefficients from a filter which is configured to reduce imaging and/or aliasing of the output audio signal. The filter may be referred to as an anti-imaging/anti-aliasing filter. The filter may be implemented as a digital filter (e.g. a Finite Impulse Response, FIR, filter) comprising a pre-determined number N of filter coefficients. The current subset of filter coefficients for determining the current output sample may be selected from the pre-determined number N of filter coefficients of the anti-imaging/anti-aliasing filter. In particular, the current subset of filter coefficients may correspond to a phase of a polyphase structure of the anti-imaging/anti-aliasing filter.

As indicated above, the anti-imaging/anti-aliasing filter may comprise a total set of N filter coefficients. This total set of filter coefficients may be subdivided into a plurality of phases of a polyphase structure, wherein each phase comprises a subset of filter coefficients from the total set of filter coefficients. In particular, the polyphase structure may comprise L phases, i.e. a number of phases which corresponds to the upsampling factor L. The subsets of filter coefficients for the different phases may then comprise N/L filter coefficients each. Typically, the subsets of filter coefficients for the different phases of the polyphase structure are mutually exclusive with respect to one another. In other words, typically, each filter coefficient from the total set of filter coefficients is only comprised within a single subset for a single phase. Furthermore, the union of the subsets of filter coefficients for the different phases typically corresponds to the total set of filter coefficients.

The system may comprise one or more look-up tables providing a mapping between phase indexes of different phases of the polyphase structure of the filter, which are to be used to determine different output samples, and phase indexes of directly preceding phases which are to be used to determine directly preceding output samples, respectively, and providing a mapping between phase indexes and respective subsets of filter coefficients from the filter.

In particular, the system may further comprise a phase look-up table providing a mapping between phase indexes of different phases of the polyphase structure of the anti-imaging/anti-aliasing filter, wherein the different phases are to be used to determine different output samples, and phase indexes of directly preceding phases which are used to determine directly preceding output samples, respectively. In other words, the phase look-up table may be indicative of a sequence of phases of the polyphase structure of the anti-imaging/anti-aliasing filter, wherein the sequence of phases is to be used to determine a corresponding sequence of output samples of the output audio signal. As such, the phase look-up table may indicate for each phase of the polyphase structure the directly following phase of the polyphase structure.

In addition, the system may comprise a filter look-up table providing a mapping between phase indexes and respective subsets of filter coefficients from the anti-imaging/anti-aliasing filter. In other words, the filter look-up table may be indicative of the subsets of filter coefficients (forming sub-filters) for the different phases of the polyphase structure.

Alternatively, the system may comprise a combined phase/filter look-up table providing a mapping between phase indexes and respective subsets of filter coefficients from the filter. The phase indexes of the combined phase/filter look-up table may be ordered in accordance to the sequence of phase indexes to be used to determine the corresponding sequence of output samples of the output audio signal. By way of example, the combined phase/filter look-up table may comprise a plurality of lines (or columns) indicating different subsets of filter coefficients for different phase indexes, and the lines (or columns) may be ordered in accordance to the sequence of phase indexes to be used to determine the corresponding sequence of output samples of the output audio signal. Hence, the ordering of the lines (or columns) of the combined phase/filter look-up table provides a mapping between phase indexes of different phases of the polyphase structure of the filter, which are to be used to determine different output samples, and phase indexes of directly preceding phases which are to be used to determine directly preceding output samples, respectively.

As a result of using a combined phase/filter look-up table, the current subset of filter coefficients for the current output sample may be determined using look-up operations based on a MODULO L pointer.

The processing unit may be configured to determine the current subset of filter coefficients based on a previous phase index for a previous output sample directly preceding the current output sample, using the one or more look-up tables.

In particular, the processing unit may be configured to determine the current phase index (which identifies a to-be-used current phase for determining the current output samples) based on a previous phase index (which identifies the phase used for determining a previous output sample directly preceding the current output sample), using the phase look-up table. As such, the determination of the current phase index (and by consequence the determination of the current phase) may be performed in a computationally efficient manner, using a look-up operation. In a similar manner, the processing unit may be configured to determine the current subset of filter coefficients based on the current phase index using the filter look-up table. As such, the processing unit may be configured to determine the filter coefficients which are to be used for determining the current output sample using computationally efficient look-up operations.

Alternatively, the processing unit may be configured to determine the current subset of filter coefficients based on the previous phase index for the previous output sample directly preceding the current output sample, using a MODULO L pointer into the combined phase/filter look-up table.

As indicated above, the system may be configured to resample the input audio signal in accordance to an upsampling factor L, with L being greater than one. The polyphase structure of the anti-imaging/anti-aliasing filter may then comprise L phases. Furthermore, the phase look-up table may then provide for each of the L phase indexes for the L phases a mapping to the phase index for the directly preceding phase. In other words, the phase look-up table may comprise L entries with mapping pairs of current and preceding phase indexes.

The phase look-up table may be indicative of a sequence of phase indexes of phases which are to be used for determining a corresponding sequence of output samples of the output audio signal. The sequence of phase indexes (i.e. the sequence of to-be-used phases) is typically dependent on the upsampling factor L and/or on the downsampling factor M. The processing unit may be configured to determine the sequence of phase indexes and/or the phase look-up table based on the upsampling factor L and/or based on the downsampling factor M. Furthermore, the processing unit may be configured to determine the subsets of filter coefficients and/or the filter look-up table. These determinations may be performed upon initialization of the resampler. The subsequent processing of the input audio signal may then be performed using a pre-determined sequence of phase indexes and/or phase look-up table, as well as pre-determined subsets of filter coefficients and/or a pre-determined filter look-up table.

The processing unit may be configured to determine the sequence of phase indexes and/or the phase look-up table by determining a base vector comprising a sequence of ascending integers from 1 to L. Furthermore, a concatenated vector may be determined from the base vector by concatenating the base vector M times. The sequence of phase indexes may be determined by selecting every $M^{th}$ entry from the concatenated vector. The phase look-up table may then be determined based on the sequence of phase indexes. This method for determining the sequence of phase indexes is beneficial, as it does not involve any computationally onerous tasks such as multiplications or divisions.

However, the above mentioned method for determining the sequence of phase indexes involves the determination and storage of a concatenated vector comprising L*M entries. In the following, an alternative method for determining the sequence of phase indexes is described, which provides an improved efficiency regarding memory resources. For determining the sequence of phase indexes, the processing unit may be configured to select a first phase index from the sequence of phase indexes. The first phase index may be increased by L or multiples of L, as long as the increased first phase index is smaller or equal to M. As a consequence, the resulting increased first phase index exceeds the value M. A second phase index which directly follows the first phase index in the sequence of phase indexes may be determined based on the increased first phase index. In particular, the second phase index may be determined by subtracting M from the increased first phase index M, to yield an intermediate phase index. The second phase index may then be determined by subtracting the intermediate phase index from L+1. The above mentioned process may be repeated in an iterative manner (by replacing the first phase index of a current iteration with the second phase index of the previous iteration), to determine the complete sequence of phase indexes.

Furthermore, the processing unit may be configured to determine the sequence of phase indexes by setting a difference between adjacent phase indexes from the sequence of phase indexes to $\Delta=[M \ MOD \ L]$, for one or more pairs of adjacent phase indexes.

The system may be designed for different resampling ratios. In other words, the system may be configured to perform resampling in accordance to different upsampling factors L and/or in accordance to different downsampling factors M. For this purpose, the phase look-up table may comprise a plurality of phase index-to-phase index mappings for a plurality of different resampling ratios L/M, respectively. Furthermore, the filter look-up table may comprise a plurality of phase index-to-subset of filter coefficients mappings for the plurality of different resampling ratios L/M, respectively. The processing unit may then be configured to select the appropriate mappings for the applicable resampling ratio.

According to a further aspect, a method for determining a sequence of phase indexes is described. The sequence of phase indexes may identify a corresponding sequence of phases of a polyphase structure of a resampling filter which is used for determining a sequence of output samples of a resampled audio signal from a sequence of input samples of an input audio signal. The method may comprise selecting a first phase index from the sequence of phase indexes. The first phase index may be increased by an upsampling factor L or by multiples of L, as long as the increased first phase index is smaller or equal to a downsampling factor M. A second phase index which directly follows the first phase index in the sequence of phase indexes may be determined based on the increased first phase index. The method may further comprise determining the second phase index by subtracting M from the increased first phase index M, to yield an intermediate phase index. In addition, the method may comprise determining the second phase index by subtracting the intermediate phase index from L+1.

According to another aspect, a method for determining a sequence of phase indexes is described. The sequence of phase indexes may identify a corresponding sequence of phases of a polyphase structure of a resampling filter, wherein the sequence of phase indexes is to be used for determining a sequence of output samples of a resampled audio signal from a sequence of input samples of an input audio signal. The method may comprise determining a base vector comprising a sequence of ascending integers from 1 to an upsampling factor L. Furthermore, the method may comprise determining a concatenated vector from the base vector by concatenating the base vector M times, wherein M is a downsampling factor. The sequence of phase indexes may be determined by selecting every $M^{th}$ entry from the concatenated vector.

According to another aspect, an audio decoding system for decoding a multi-channel audio signal comprising a plurality of different channels is described. The plurality of different channels may comprise one or more surround channels. The audio decoding system may be configured to receive a bitstream indicative of the multi-channel audio signal. The bitstream may be decoded to provide the multi-channel audio signal. Furthermore, the audio decoding system may be configured to determine whether a first condition and a second condition are met. The first condition may comprise or may indicate that the multi-channel audio signal is to be downmixed to a reduced number of channels. This downmixing may be performed in the context of decoding of the bitstream or subsequent to decoding of the bitstream. As such, the first condition may be directed at the audio decoding system being aware of an upcoming downmixing of the multi-channel audio signal.

The second condition may comprise or may indicate that the one or more surround channels have already been phase shifted with respect to one or more of the others of the plurality of different channels. In other words, the audio decoding system may be configured to verify whether the one or more surround channels of the multi-channel audio signal have already been phase shifted. The phase shift may correspond to a 90 degrees phase shift with respect to the other channels of the multi-channel audio signal. The second condition may be verified based on information (e.g. a flag) comprised within the received bitstream. Hence, the second condition may be determined based on an indication (e.g. a flag) comprised within the bitstream. Alternatively or in addition, the audio decoding system may be configured to analyze the multi-channel audio signal, in order to determine a probability for the fact that the one or more surround channels have been phase shifted with respect to one or more of the others of the plurality of different channels (as outlined in the present document).

The audio decoding system may be configured to apply a phase shift to the one or more surround channels to yield one or more phase shifted surround channels, if the first condition is met (i.e. if the multi-channel audio signal is going to be downmixed) and if the second condition is not met (i.e. if the audio decoding system could not confirm that the one or more surround channels have already been phase shifted). The phase shift to the one or more surround channels may be applied only if the first condition is met and if the second condition is not met. Otherwise, the phase of the one or more surround channels may be left unchanged. The audio decoding system may be configured to apply a 90 degrees phase shift to the one or more surround channels with respect to one or more of the others of the plurality of different channels.

As such, the audio decoding system may be configured to ensure a consistent phase shift of the one or more surround channels. Such a consistent phase shift is typically beneficial for channel separation in the context of matrix encoding (i.e. downmixing) and matrix decoding (i.e. upmixing). Furthermore, the occurrence of signal canceling phase shifts can be prevented or reduced. Such signal cancellations may occur due to multiple applications of a phase shift to the one or more surround channels.

The audio decoding system may be further configured to determine a downmixed audio signal from the multi-channel audio signal, using matrix encoding. The downmixed audio signal typically comprises less channels than the multi-channel audio signal. As part of the matrix encoding, the audio decoding system may be configured to attenuate the one or more (phase shifted) surround channels to yield one or more attenuated surround channels, and to combine the one or more attenuated surround channels with one or more of the others of the plurality of different channels, to yield one or more channels of the downmixed audio signal.

According to another aspect, an audio encoding system for encoding a multi-channel audio signal into a bitstream is described. The multi-channel audio signal comprises a plurality of different channels. The plurality of different channels may comprise one or more surround channels. The audio encoding system may be configured to determine a probability for the fact that the one or more surround channels have been phase shifted with respect to one or more of the others of the plurality of different channels. Determining the probability may comprise analyzing audio content of the plurality of different channels. In particular, a spectrum of the audio content of the plurality of different channels may be analyzed. Furthermore, phases of the spectra of the plurality of different channels may be compared.

Alternatively or in addition, the probability may be determined based on a history of the multi-channel audio signal. By way of example, the audio encoding system may be aware of the origin and/or of the previous processing of the multi-channel audio signal. In particular, the audio encoding system may be aware of a (complete) chain of processing of the multi-channel audio signal (starting from recording of the audio signal). This knowledge may be used to determine the probability for the fact that the one or more surround channels have been phase shifted with respect to one or more of the others of the plurality of different channels. In particular, this knowledge may be used to exclude (probability=0%) or to confirm (probability=100%) the fact that the one or more surround channels have been phase shifted.

Furthermore, the audio encoding system may be configured to insert into the bitstream an indication for the fact that the one or more surround channels have been phase shifted with respect to one or more of the others of the plurality of different channels, if the determined probability exceeds a pre-determined probability threshold. The indication may comprise a pre-determined bit or flag of the bitstream.

According to a further aspect, a method for decoding a multi-channel audio signal comprising a plurality of different channels is described. The plurality of different channels may comprise one or more surround channels. The method may comprise receiving a bitstream indicative of the multi-channel audio signal. Furthermore, the method comprises determining whether a first condition and a second condition are met. The first condition may comprise the verification that the multi-channel audio signal is to be downmixed to a reduced number of channels. The second condition comprises the verification that the one or more surround channels have been phase shifted with respect to one or more of the others of the plurality of different channels. This may be determined based on an indication (e.g. a flag) comprised within the bitstream. Alternatively or in addition, this may be determined based on the multi-channel audio signal itself and/or based on a knowledge regarding the processing chain of the multi-channel audio signal. The method may further comprise applying a phase shift to the one or more surround channels to yield one or more phase shifted surround channels, if the first condition is met and if the second condition is not met.

According to another aspect, a method for encoding a multi-channel audio signal into a bitstream is described. The multi-channel audio signal may comprise a plurality of different channels. The plurality of different channels may comprise one or more surround channels. The method may comprise determining a probability for the fact that the one or more surround channels have been phase shifted with respect to one or more of the others of the plurality of different channels. Furthermore, the method may comprise inserting into the bitstream an indication for the fact that the one or more surround channels have been phase shifted with respect to one or more of the others of the plurality of different channels, if the determined probability exceeds a pre-determined probability threshold.

According to a further aspect, an audio encoding system for encoding an audio signal comprising a sequence of audio frames into a bitstream comprising a corresponding sequence of bitstream frames is described. The audio encoding system may be configured to provide a first sequence of substream frames for the corresponding sequence of audio frames. The first sequence of substream frames may comprise a first representation of the sequence of audio frames. A representation may comprise a number of channels (e.g. 2 channels or 5.1 channels) representing the audio signal. Alternatively or in addition, a representation may comprise an indication of the bit-rate or a representation may be associated with a bit-rate of the sequence of substream frames. The audio encoding system may further be configured to provide a second sequence of substream frames for the corresponding sequence of audio frames. The first and second sequences may comprise different representations of the same sequence of audio frames.

In addition, the audio encoding system may be configured to determine the sequence of bitstream frames such that a bitstream frame comprises corresponding substream frames from the first and second sequences at different locations within the bitstream frame. In particular, the sequence of bitstream frames may be determined such that each bitstream frame comprises the corresponding substream frames from the first and second sequences. As such, the bitstream may comprise multiple representations of the same audio signal. The different representations may differ e.g. with respect to the number of channels and/or with respect to the bit-rate. Alternatively or in addition, the bitstream may comprise different sequences of substream frames for corresponding sequences of audio frames from different audio signals.

The audio encoding system may also be configured to insert control information into a bitstream frame of the sequence of bitstream frames, wherein the control information is indicative of the locations and/or of the representations of the substream frames comprised within the bitstream frame. Such control information may be inserted into each of the bitstream frames of the sequence of bitstream frames. The control information enables an audio processing system to identify one or more of the sequences of substream frames from the bitstream, without the need for decoding the complete sequence of bitstream frames.

The control information may comprise first and second control information for the first and second sequences, respectively. In particular, each of the bitstream frames may comprise first and second control information for identifying the substream frames of the first and second sequences, which are comprised within the bitstream frames. The audio encoding system may be configured to encode the first and second control information using code words of different lengths. In other words, the audio encoding system may be configured to use variable length encoding for encoding the control information.

The length of the code words used for encoding the first and the second control information, respectively, may depend on a bit-rate of the first and second sequences, respectively. In particular, the length of one or more code words used for encoding the first control information may be larger than the length of one or more code words used for encoding the second control information, if the bit-rate of the first sequence is higher than the bit-rate of the second sequence, and/or vice versa.

As such, the audio encoding system may be configured to encode the first and second control information using a variable length code, such that if—in average—the first sequence of substream frames comprises a higher number of bits than the second sequence of substream frames, then—in average—the first control information may comprise a higher number of bits than the second control information, and vice versa. In other words, the audio encoding system may be configured to encode the first and second control information using a variable length code, such that a difference between the relative overheads of the first and second sequences of substream frames, which are due to the first and second control information, respectively, is reduced.

According to a further aspect, an audio processing system configured to receive and to process an input bitstream comprising a corresponding sequence of bitstream frames is described. The bitstream frames from the sequence of bitstream frames comprise at different locations within the bitstream frames corresponding substream frames from a first and from a second sequence of substream frames. The first and second sequences may comprise different representations of a same sequence of audio frames. Furthermore, the bitstream frames of the sequence of bitstream frames may comprise control information which is indicative of the locations and/or of the representations of the substream frames from the first and second sequences comprised within the bitstream frames. The audio processing system may be configured to extract the first and/or second sequence of substream frames from the sequence of bitstream frames using the control information. In particular, the audio processing system may be configured to extract the first and/or second sequence of substream frames from the sequence of bitstream frames without having to decode the first sequence of substream frames and/or without having to decode the second sequence of substream frames. As such, the audio processing system may be configured to identify one or more of the sequences of substream frames in a computationally efficient manner.

In addition, the audio processing system may be configured to insert the substream frames of the first sequence into a corresponding sequence of bitstream frames of an output bitstream. Furthermore, the audio processing system may be configured to insert control information into the bitstream frames of the output bitstream. The control information may be indicative of the location and/or of the representation of the substream frames from the first sequence within the bitstream frames of the output bitstream. As such, the audio processing system may be configured to generate in a computationally efficient manner an output bitstream which comprises a selection of the sequences of sub stream frames comprised within the input bitstream.

According to a further aspect, a method for encoding an audio signal comprising a sequence of audio frames into a bitstream comprising a corresponding sequence of bitstream frames is described. The method may comprise the step of providing a first sequence of substream frames for the corresponding sequence of audio frames, and providing a second sequence of substream frames for the corresponding sequence of audio frames. The first and second sequences typically comprise different representations of the same sequence of audio frames. The method may further comprise determining the sequence of bitstream frames such that the bitstream frames comprise corresponding substream frames from the first and second sequences at different locations within the bitstream frames. In addition, the method may comprise inserting control information into a bitstream frame of the sequence of bitstream frames. The control information may be indicative of the locations and/or of the representations of the substream frames comprised within the bitstream frame.

According to another aspect, a method for processing a bitstream indicative of an audio signal comprising a sequence of audio frames is described. The method comprises receiving an input bitstream which comprises a corresponding sequence of bitstream frames. A bitstream frame may comprise at different locations or positions within the bitstream frame corresponding substream frames from a first and from a second sequence of substream frames. The first and second sequences may comprise different representations of the same sequence of audio frames. A bitstream frame of the sequence of bitstream frames may comprise control information which is indicative of the locations/positions and/or of the representations of the substream frames comprised within the bitstream frame. Furthermore, the method may comprise extracting the first sequence of substream frames from the sequence of bitstream frames using the control information.

According to a further aspect, an audio processing system for processing a bitstream comprising a corresponding sequence of bitstream frames is described. The sequence of bitstream frames may be indicative of a corresponding sequence of audio frames of an audio signal. The audio processing system may be configured to generate a sequence of counter values for the sequence of bitstream frames, respectively. The sequence of counter values may comprise sequentially ordered counter values (e.g. ascending or descending counter values). Furthermore, the counter values may comprise a minimum value and a maximum value. The maximum value may be followed by the minimum value within the sequence of counter values, or vice versa. In other words, the counter values may cycle periodically between the minimum value and the maximum value.

The audio processing system may be configured to insert the counter values from the sequence of counter values into the bitstream frames from the sequence of bitstream frames. The counter values may be inserted as control information into the bitstream frames. As a result of the insertion of the counter values, the control information (i.e. the counter values) of the bitstream frames may be indicative of the sequential order of the bitstream frames within the sequence of bitstream frames. This may be beneficial for detecting splicing points within bitstreams comprising a concatenation of different sequences of bitstream frames. A splicing point may be detected based on the counter values. In particular, a splicing point may be detected based on a particular value of the counter value and/or based on a discontinuity of the counter values of directly succeeding bitstream frames.

The bitstream frames typically further comprise payload data indicative of corresponding audio frames of the audio signal. The counter values and/or the control information may be positioned at an extremity (e.g. at the beginning or at the end) of the bitstream frames. In other words, the counter values and/or the control information may be positioned at a pre-determined position/location within the bitstream frames. In particular, the counter values and/or the control information may be positioned upstream of or downstream of the payload data. By way of example, the bitstream frame may first comprise control information (e.g. a frame synchronization word and/or bitstream version information) followed by a counter value at a pre-determined location. The positioning of the counter values and/or of the control information at exposed and/or pre-determined locations of the bitstream frames may simplify the identification of the counter values and/or control information, thereby simplifying the processing of the bitstream and the detection of splicing points.

According to another aspect, an audio processing system for generating a spliced bitstream is described. The spliced bitstream may be generated from a first bitstream comprising a corresponding first sequence of bitstream frames and from a second bitstream comprising a corresponding second sequence of bitstream frames. The first sequence of bitstream frames may be indicative of a corresponding first sequence of audio frames of a first audio signal, and the second sequence of bitstream frames may be indicative of a corresponding second sequence of audio frames of a second audio signal. The second audio signal may be different from the first audio signal.

The bitstream frames of the first sequence of bitstream frames comprise first counter values which are indicative of a sequential order of the bitstream frames within the first sequence of bitstream frames. In a similar manner, the bitstream frames of the second sequence of bitstream frames comprise second counter values which are indicative of a sequential order of the bitstream frames within the second sequence of bitstream frames. As such, the first and second bitstreams comprise first and second counter values, respectively.

The audio processing system may be configured to truncate the first bitstream at a particular bitstream frame from the first sequence of bitstream frames, and to thereby provide a truncated bitstream. Furthermore, the audio processing system may be configured to concatenate the truncated bitstream with the second sequence of bitstream frames, and to thereby provide the spliced bitstream. As a result of the concatenation and as the result of providing counter values, the first counter values comprised within the first part of the spliced bitstream and the second counter values comprised within the second part of the spliced bitstream may be indicative of a splicing point between the first and second bitstreams. In particular, the first counter value of the particular bitstream frame and/or the second counter value of the bitstream frame which follows the particular bitstream frame within the spliced bitstream may be indicative of a splicing point between the first and second bitstreams. Even more particularly, a discontinuity between the first counter value of the particular bitstream frame and the second counter value of the bitstream frame which follows the particular bitstream frame within the spliced bitstream may be indicative of a splicing point between the first and second bitstreams.

The audio processing system may be further configured to set the first counter value of the particular bitstream frame to a pre-determined counter value, and/or to set the second counter value of the bitstream frame which follows the particular bitstream frame within the spliced bitstream to the pre-determined counter value. As such, the counter value of the particular bitstream frame (referred to as the first counter value) may indicate the bitstream frame which directly precedes the splicing point and/or the counter value of the bitstream frame which directly follows the particular bitstream (referred to as the second counter value) may indicate the bitstream frame which directly follows the splicing point. Typically, it is sufficient to assign only one of the counter values (of the bitstream frame either directly before or directly after the splicing point) to the pre-determined counter value. In particular, it may be beneficial for real-time processing to (only) set the counter value of the bitstream frame which directly follows the splice point to the pre-determined counter value.

The pre-determined counter value may lie outside of the counter value range of counter values given by the minimum value and the maximum value of the counter values. In other words, the first and/or second counter values may take on values from a counter value range between the minimum value and the maximum value. The pre-determined counter value may lie outside the counter value range. By way of example, the minimum value of the counter values may be "1" and the pre-determined counter value may be "0". The detection of a counter value which is set to the pre-determined value may indicate the presence of a splicing point between the particular bitstream frame and the bitstream frame which follows the particular bitstream frame within the spliced bitstream.

According to another aspect, a method for enabling the detection of splicing of a bitstream is described. The bitstream comprises a sequence of bitstream frames, wherein the sequence of bitstream frames is indicative of a corresponding sequence of audio frames of an audio signal. The method comprises generating a sequence of counter values for the sequence of bitstream frames, respectively. Furthermore, the method comprises inserting the counter values from the sequence of counter values, e.g. as control information, into the bitstream frames from the sequence of bitstream frames, such that the control information of the bitstream frames is indicative of a sequential order of the bitstream frames within the sequence of bitstream frames.

According to a further aspect, a method for generating a spliced bitstream indicative of a splicing point is described. The method comprises truncating a first bitstream at a particular bitstream frame from a first sequence of bitstream frames, to provide a truncated bitstream. The first sequence of bitstream frames is indicative of a corresponding first sequence of audio frames of a first audio signal. The bitstream frames of the first sequence of bitstream frames comprise first counter values which are indicative of a sequential order of the bitstream frames within the first sequence of bitstream frames. Furthermore, the method comprises concatenating the truncated bitstream with a second bitstream comprising a second sequence of bitstream frames, to provide the spliced bitstream. The second sequence of bitstream frames is indicative of a corresponding second sequence of audio frames of a second audio signal. The bitstream frames of the second sequence of bitstream frames comprise second counter values which are indicative of a sequential order of the bitstream frames within the second sequence of bitstream frames. The first counter value of the particular bitstream frame and/or the second counter value of the bitstream frame which follows the particular bitstream frame within the spliced bitstream may be indicative of the splicing point between the first and second bitstreams.

According to a further aspect, an audio decoding system for decoding a spliced bitstream is described. The spliced bitstream comprises a concatenation of a first and a second sequence of bitstream frames. The first and second sequences are indicative of first and second audio signals, respectively. The bitstream frames of the first sequence of bitstream frames comprise first counter values which are indicative of a sequential order of the bitstream frames within the first sequence of bitstream frames. The bitstream frames of the second sequence of bitstream frames comprise second counter values which are indicative of a sequential order of the bitstream frames within the second sequence of bitstream frames.

The audio decoding system may be configured to detect a splicing point between the first and the second concatenated sequences, based on the first and second counter values. The splicing point may be detected based on a discontinuity of the counter values of adjacent bitstream frames and/or based on a counter value having a pre-determined counter value (as outlined in the present document).

Furthermore, the audio decoding system may be configured to determine whether data necessary for correctly decoding a bitstream frame of the spliced bitstream subsequent to the splicing point is available. The data necessary for correctly decoding a bitstream frame may comprise settings of a decoding scheme used for decoding the second sequence of bitstream frames. Furthermore, it may need to be ensured that the bitstream frame is not dependent on a previous bitstream frame (which is not comprised within the spliced bitstream, due to the splicing). In other words, it may need to be ensured that the bitstream frame is an independent (i.e. I) frame comprising all the encoded audio data necessary for decoding.

In addition, the audio decoding system may be configured to suspend decoding of the bitstream frame of the spliced bitstream subsequent to the splicing point, if the data is not available. In particular, the audio decoding system may be configured to suspend decoding of (all) the bitstream frames subsequent to the splicing point, up to a bitstream frame of the spliced bitstream for which (all) the data necessary for correct decoding is available. Alternatively or in addition, the audio decoding system may be configured to provide an audio frame indicative of silence for a bitstream frame for which decoding has been suspended. As such, the audio decoding system may be configured to render "silence" subsequent to a splicing point, up to the time instant (i.e. up to the bitstream frame) when all the data necessary for correct decoding is available. By doing this, the output of audible artifacts can be reduced.

According to another aspect, a method for decoding a spliced bitstream comprising a concatenation of a first and a second sequence of bitstream frames is described. The first and second sequences may be indicative of first and second audio signals, respectively. The bitstream frames of the first sequence of bitstream frames comprise first counter values which are indicative of a sequential order of the bitstream frames within the first sequence of bitstream frames. The bitstream frames of the second sequence of bitstream frames comprise second counter values which are indicative of a sequential order of the bitstream frames within the second sequence of bitstream frames. The method may comprise detecting a splicing point between the first and the second sequences, based on the first and second counter values. Furthermore, the method comprises determining whether (all) data necessary for correctly decoding a bitstream frame of the spliced bitstream subsequent to the splicing point is available. In addition, the method may comprise suspending decoding of the bitstream frame of the spliced bitstream subsequent to the splicing point and/or outputting silence for the bitstream frame, if the data is not available.

According to further aspect, an audio processing system for processing a bitstream is described. The audio processing system may comprise or may be e.g. an audio decoding system or a sample rate conversion system or an audio encoding system. The bitstream may comprise a concatenation of a first and a second sequence of bitstream frames, wherein the first and second sequence are indicative of one or more audio signals. The one or more audio signals may be referred to as a set of audio signals. In case of a spliced bitstream, the first sequence may be indicative of a first audio signal (or a first set of audio signals) and the second sequence may be indicative of a second audio signal (or a second set of audio signals). However, both, the first and second sequence may also be indicative of excerpts of the same audio signal having different temporal properties, such as length and/or position in time.

The bitstream frames of the first sequence of bitstream frames comprise first counter values which are indicative of a sequential order of the bitstream frames within the first sequence of bitstream frames. Furthermore, the first sequence comprises a first subsequence of bitstream frames with a pre-determined suite of frame lengths. The suite of frame lengths of the first subsequence is such that the bitstream frames of the first subsequence exhibit a first pre-determined average frame length N.

The bitstream frames of the second sequence of bitstream frames comprise second counter values which are indicative of a sequential order of the bitstream frames within the second sequence of bitstream frames. Furthermore, the second sequence may comprise a second subsequence of bitstream frames with another (possibly different) pre-determined suite of frame lengths (wherein the frame lengths may be measured e.g. in number of samples). The suite of frame lengths of the second subsequence may be such that the bitstream frames of the second subsequence exhibit a second pre-determined average frame length K.

The audio processing system is configured to detect a transition point between the first and the second sequence. The transition point may be an arbitrary splicing point (also referred to as a splice point) between different audio signals (at an arbitrary position within the bitstream). Alternatively or in addition, the transition point may correspond to a point within the bitstream where the frame rate of the bitstream changes.

The audio processing system is further configured to determine a first bitstream frame from the first sequence of bitstream frames, wherein the first bitstream frame directly precedes the transition point. In addition, the audio processing system is configured to determine a sequence index value $i_1$ of the first bitstream frame based on the first counter value $q_1$ of the first bitstream frame. The sequence index value $i_1$ may be indicative of a position and/or a frame length of the first bitstream frame within the first subsequence. In particular, the sequence index value $i_1$ may be indicative of the frame length of the first bitstream frame within the suite of pre-determined frame lengths of the first subsequence.

In addition, the audio processing system is configured to determine a second bitstream frame from the second sequence of bitstream frames, wherein the second bitstream frame directly succeeds the transition point. The audio processing system may then determine a sequence index value $i_2$ of the second bitstream frame based on the sequence index value $i_1$ of the first bitstream frame. In a similar manner to the sequence index value $i_1$, the sequence index value $i_2$ may be indicative of a position and/or a frame length of the second bitstream frame within the second subsequence. In particular, the sequence index value $i_2$ may be indicative of the frame length of the second bitstream frame within the suite of pre-determined frame lengths of the second subsequence.

By determining the sequence index value $i_2$ of the second bitstream frame based on the sequence index value $i_1$ of the first bitstream frame, it can be ensured that the "phase" of the bitstream 610 is maintained or locked, even at a splicing point and/or even subject to a frame rate change. As a result of this, the audio quality of a decoded bitstream may be improved.

The sequence index value $i_1$ of the first bitstream frame may be determined as $i_1 = q_1$ mod Z, wherein Z is the number of bitstream frames within the first subsequence. This may also be applicable to the second bitstream frame.

The sequence index value $i_1$ of the first bitstream frame may be associated with a first remainder value $r_1$, wherein the first remainder value $r_1$ may be indicative of a difference between an intermediate average frame length for the bitstream frames of the first subsequence up to the first bitstream frame and the first pre-determined average frame length. The audio processing system may be configured to determine a first pseudo sequence index value $\hat{i}_1$ based on the first remainder value $r_1$ and based on the second pre-determined average frame length. In particular, it may be determined which sequence index $\hat{i}_1$ the first remainder value $r_1$ would be associated with if the first sequence of bitstream frames would exhibit the second pre-determined average frame length (instead of the first pre-determined average frame length). The sequence index value $i_2$ of the second bitstream frame may then be determined based on the pseudo sequence index value $\hat{i}_1$. In particular, the sequence index value $i_2$ of the second bitstream frame may be determined as $i_2 = (\hat{i}_1 + 1)$ mod Z, wherein Z is the number of bitstream frames of the second subsequence (if the frame rate remains unchanged).

As indicated above, the transition point may be a splicing point. In such a case, the transition point may be detected based on the first and/or second counter values. In particular, the transition point may be detected based on the second counter value of the second bitstream frame, e.g. based on the second counter value of the second bitstream frame having a pre-determined counter value. As such, the "phase" locking of the bitstream may also be applicable to indicated splicing points, i.e. to splicing points which are indicated by a pre-determined counter value.

The first pre-determined average frame length may be a rational number and not an integer number. On the other hand, the pre-determined suite of frame lengths of the bitstream frames of the first subsequence may be integer numbers. As such, the first subsequence may be used to provide a fractional average frame length using a suite of integer frame lengths. The suite of frame lengths may be repeated to form the first sequence. In a similar manner, the second pre-determined average frame length may be a rational number and not an integer number, and the pre-determined suite of frame lengths of the bitstream frames of the second subsequence may be integer numbers.

The first pre-determined average frame length may be different from the second pre-determined average frame length. In particular, the ratio K/N or the ratio N/K may be an integer number greater 1. As such, "phase" locking may also be applicable to frame rate changes.

According to another aspect, an audio processing system for processing a bitstream is described. The audio processing system may comprise or may be e.g. an audio decoding system or a sample rate conversion system or an audio encoding system. The bitstream may comprise a concatenation of a first and a second sequence of bitstream frames, wherein the first and second sequence are indicative of one or more audio signals, e.g. of a set of audio signals. In case of a spliced bitstream, the first sequence may be indicative of a first audio signal (e.g. of a first set of audio signals) and the second sequence may be indicative of a second audio signal (e.g. of a second set of audio signals). However, both, the first and second sequence may also be indicative of different excerpts of the same audio signal, wherein the different excerpts have different temporal properties such as length and/or positions in time.

The bitstream frames of the first sequence of bitstream frames comprise first counter values which are indicative of a sequential order of the bitstream frames within the first sequence of bitstream frames. Furthermore, the first sequence exhibits a first average frame length. The bitstream frames of the second sequence of bitstream frames comprise second counter values which are indicative of a sequential order of the bitstream frames within the second sequence of bitstream frames. In addition, the second sequence exhibits a second average frame length. The first and second average frame length may be different.

The audio processing system is configured to detect a transition point between the first and the second sequence. Furthermore, the audio processing system is configured to determine a first bitstream frame from the first sequence of bitstream frames directly preceding the transition point and to determine the first counter value $q_1$ of the first bitstream frame. In addition, the audio processing system is configured to determine a second bitstream frame from the second sequence of bitstream frames directly succeeding or following the transition point and to determine the second counter value $q_1$ of the second bitstream frame.

Furthermore, the audio processing system may be configured to determine whether the transition point is a splicing point, based on the first counter value $q_1$, the second counter value $q_2$, the first average frame length, and the second average frame length. As such, the presence of a splicing point may be determined in a reliable manner (even in case of frame rate changes). As a result of this, the perceptual quality of the decoded bitstream may be improved.

In particular, the audio processing system may be configured to determine a target counter value k for the second bitstream frame based on the first counter value $q_1$, based on the first average frame length, and based on the second average frame length. The target counter value k for the second bitstream frame may also be determined based on a maximum value $Q_{max}$ and/or on a minimum value $Q_{min}$ of the first counter values. In addition, the audio processing system may be configured to compare the target counter value k with the second counter value $q_2$ to determine whether the transition point is a splicing point. Even more particularly, the audio processing system may be configured to determine that the transition point is a splicing point (only) if the target counter value k is different from second counter value $q_2$.

N may be the average frame length and K may be the second average frame length. The ratio K/N may be an integer number greater 1, i.e. the frame rate may be increased at the transition point. The target counter value k may then be determined as $$k = \frac{K}{N}\left(\left(q_1\right) \bmod \left(Q_{max} \cdot \frac{N}{K}\right)\right) + Q_{min}).$$

Alternatively, the ratio N/K may be an integer number greater 1, i.e. the frame rate may be decreased at the transition point. The target counter value k may then be determined as $$k = \frac{K}{N}\left(\left(q_1\right) \bmod \left(\frac{N}{2K} \cdot Q_{max}\right)\right) + Q_{min}) + \left(m \cdot Q_{max} \cdot \frac{K}{N}\right);$$

with $q_1 = 4$ s; $s \in \mathbb{N}^*$;

$$m \in \left\{0, \ldots, \frac{N}{K} - 1\right\}.$$

According to a further aspect, a method for processing a bitstream comprising a concatenation of a first and a second sequence of bitstream frames is described. The first and second sequences are indicative of one or more audio signals. The bitstream frames of the first sequence of bitstream frames comprise first counter values which are indicative of a sequential order of the bitstream frames within the first sequence of bitstream frames. The first sequence comprises a first subsequence of bitstream frames with a pre-determined suite of frame lengths, such that the bitstream frames of the first subsequence exhibit a first average frame length. The bitstream frames of the second sequence of bitstream frames comprise second counter values which are indicative of a sequential order of the bitstream frames within the second sequence of bitstream frames. The second sequence comprises a second subsequence of bitstream frames with a pre-determined suite of frame lengths, such that the bitstream frames of the second subsequence exhibit a second pre-determined average frame length.

The method comprises detecting a transition point between the first and the second sequences and determining a first bitstream frame from the first sequence of bitstream frames directly preceding the transition point. Furthermore, the method comprises determining a sequence index value $i_1$ of the first bitstream frame based on the first counter value $q_1$ of the first bitstream frame, wherein the sequence index value $i_1$ is indicative of a position of the first bitstream frame within the first subsequence. In addition, the method comprises determining a second bitstream frame from the second sequence of bitstream frames directly succeeding the transition point. The method further comprises determining a sequence index value $i_2$ of the second bitstream frame based on the sequence index value $i_1$ of the first bitstream frame, wherein the sequence index value $i_2$ is indicative of a position of the second bitstream frame within the second subsequence.

According to another aspect, a method for processing a bitstream comprising a concatenation of a first and a second sequence of bitstream frames is described. The first and second sequences are indicative of one or more audio signals. The bitstream frames of the first sequence of bitstream frames comprise first counter values which are indicative of a sequential order of the bitstream frames within the first sequence of bitstream frames. The first sequence exhibits a first average frame length. The bitstream frames of the second sequence of bitstream frames comprise second counter values which are indicative of a sequential order of the bitstream frames within the second sequence of bitstream frames. The second sequence exhibits a second average frame length.

The method comprises detecting a transition point between the first and the second sequences and determining a first bitstream frame from the first sequence of bitstream frames directly preceding the transition point. In addition, the method comprises determining the first counter value $q_1$ of the first bitstream frame. Furthermore, the method comprises determining a second bitstream frame from the second sequence of bitstream frames directly succeeding the transition point, and determining the second counter value $q_2$ of the second bitstream frame. The method further comprises determining whether the transition point is a splicing point based on the first counter value $q_1$, the second counter value $q_2$, the first average frame length, and the second average frame length.

According to a further aspect, a software program is described. The software program may be adapted for execution on a processor and for performing the method steps outlined in the present document when carried out on the processor.

According to another aspect, a storage medium is described. The storage medium may comprise a software program adapted for execution on a processor and for performing the method steps outlined in the present document when carried out on the processor.

According to a further aspect, a computer program product is described. The computer program may comprise executable instructions for performing the method steps outlined in the present document when executed on a computer.

It should be noted that the methods and systems including its preferred embodiments as outlined in the present patent application may be used stand-alone or in combination with the other methods and systems disclosed in this document. Furthermore, all aspects of the methods and systems outlined in the present patent application may be arbitrarily combined. In particular, the features of the claims may be combined with one another in an arbitrary manner.

SHORT DESCRIPTION OF THE FIGURES

The invention is explained below in an exemplary manner with reference to the accompanying drawings, wherein FIG. 1a illustrates a conceptual diagram of an example resampler;

DETAILED DESCRIPTION OF THE INVENTION

Figure 1A:
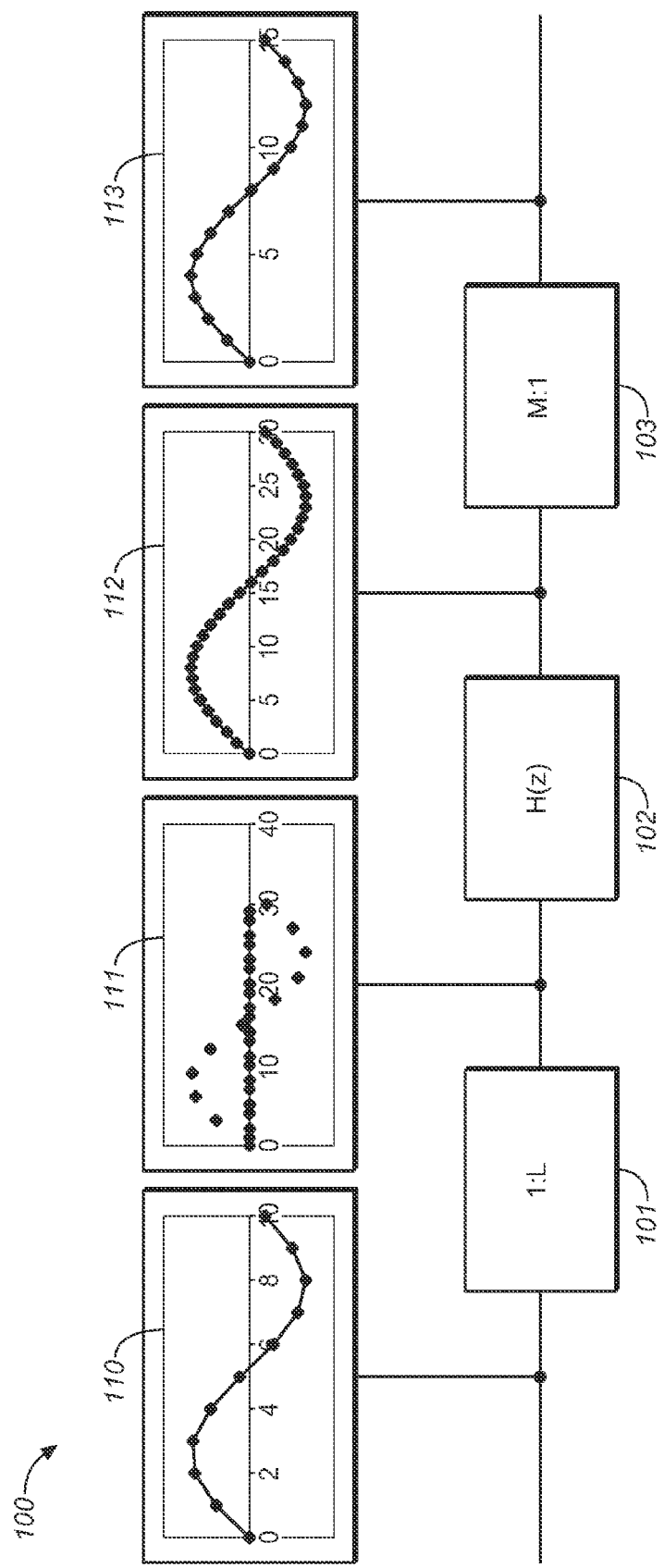
FIG. 1b shows an example structure of a polyphase implementation of a resampler.

FIG. 1a illustrates the concept of an example rational resampler 100. The rational resampler 100 comprises an up-by-L upsampler 101 which converts a sample of an input audio signal 110 into L samples of an upsampled audio signal 111. This may be achieved by inserting L−1 zeros between two samples of the input audio signal 110. Subsequently, the upsampled audio signal is filtered by an anti-aliasing/anti-imaging filter 102 with transfer function H(z). This results in a filtered audio signal 112. Finally, the filtered audio signal 112 is passed to a down-by-M decimator or downsampler 103 which only retains every $M^{th}$ sample of the filtered audio signal 112, to thereby provide the resampled (or output) audio signal 113. In case of a resampling of an input audio signal 110 at a sampling rate of 32 kHz to an output audio signal 113 at a sampling rate of 48 kHz, L is 3 and M is 2. In case of a resampling of an input audio signal 110 at a sampling rate of 44.1 kHz to an output audio signal 113 at a sampling rate of 48 kHz, L is 160 while M is 147.

It should be noted that the filter 102 runs at an intermediate frequency (IF) at L times the input sampling rate or at M times the output sampling rate (e.g. IF=M*48 kHz for the above mentioned cases). This means that the anti-aliasing filters 102 typically operate at high sampling rates, such that a reduction of the number of computational filter operations is desirable. In other words, it is desirable to reduce the number of required coefficients of the anti-aliasing filter 102, in order to reduce the overall computational complexity of the rational resampler 100.

Figure 1B:
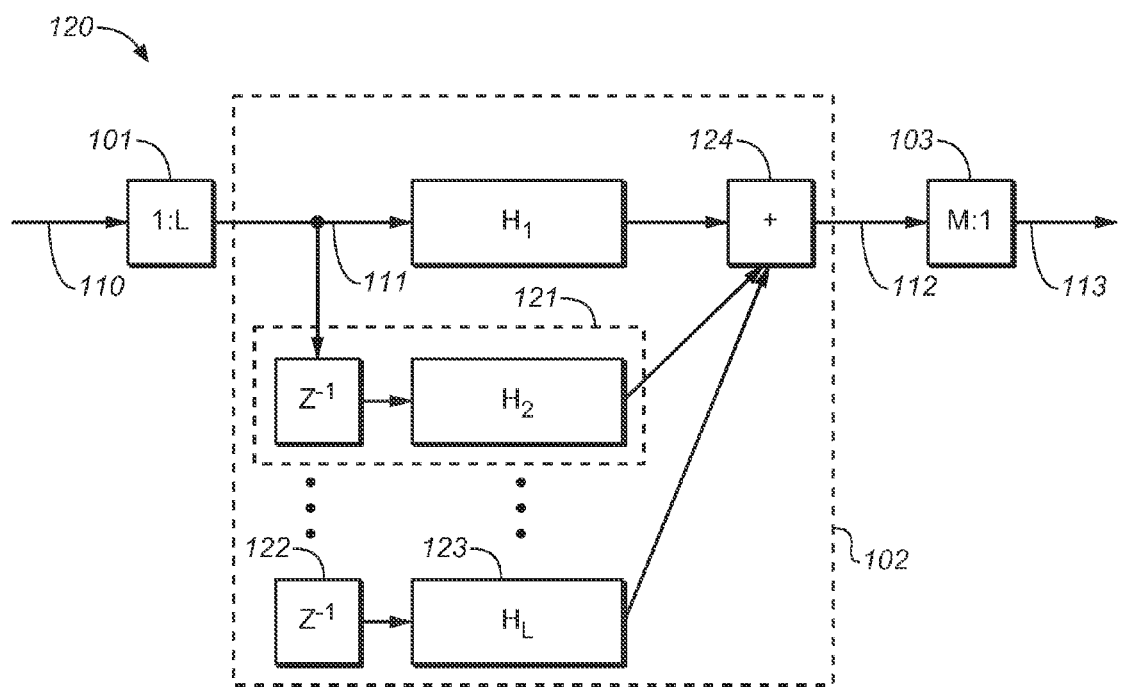

The filters may be realized as a polyphase FIR (Finite Impulse Response) implementation as shown in FIG. 1b. Such an implementation exploits the fact that the upsampled audio signal 111 which is filtered by filter 102 comprises L−1 zeros between the samples of the input audio signal 110. Consequently, the "zero" multiplications and additions can be omitted. Furthermore, a polyphase implementation exploits the fact that due to the subsequent down-by-M decimator 103, only every $M^{th}$ sample of the filtered audio signal 112 needs to be determined. By exploiting this information during the filter implementation, the number of multiplication and/or adding operations can be significantly reduced, thereby reducing the computational complexity of the rational resampler 100. Nevertheless, it is desirable to further reduce the computational complexity of the resampler 100.

FIG. 1b shows an example resampler 120 comprising a polyphase filter 102. The polyphase filter 102 comprises a plurality of phases 121, wherein each phase 121 comprises a sub-filter 123 of the filter 102 with the overall transfer function H(z). In case of $H(z)=\sum_{n=0}^{N-1} h_n z^{-n}$, with N being the total number of filter coefficients $h_n$, with n=0, ..., N−1, the total transfer function may be subdivided into L sub-transfer functions for the L sub-filters 123 of the L phases 121, with $H(z)=\sum_{l=1}^{L} \tilde{H}_l(z)$. The sub-transfer functions $\tilde{H}_l(z)$, with l=1, ..., L may be given by $$\tilde{H}_l(z) = \sum_{n=0}^{N/L-1} h_{Ln+l-1} z^{-Ln-l+1} = z^{-l+1} \sum_{n=0}^{N/L-1} h_{Ln+l-1} z^{-Ln} =$$

$$z^{-l+1} H_l(z), \text{ with } H_l(z) = \sum_{n=0}^{N/L-1} h_{Ln+l-1} z^{-Ln}.$$

FIG. 1b illustrates the polyphase implementation of the transfer function $H(z)=\sum_{l=1}^{L} \tilde{H}_l(z)$, with delay units 122 (for implementing $z^{-l+1}$), with filters 123 (for implementing $H_l(z)$) and with an adding unit 124 (for implementing the summation $H(z)=\sum_{l=1}^{L} \tilde{H}_l(z)$).

It can be seen from the formula above that the up-by-L upsampler 101 can be included into the polyphase filter by replacing the delay $z^{-Ln}$, with n=0, ..., N/L−1 by the delay $z^{-n}$. Furthermore, the down-by-M downsampler 103 can be taken into account by only determining every $M^{th}$ output sample of the polyphase filter.

Figure 2:
FIG. 2 shows a table indicating an example relationship between input samples and output samples of a resampler.

FIG. 2 illustrates how samples 203 of the output audio signal 113 are determined from the samples 204 of the input audio signal 110 using a polyphase implementation of a resampler 120. FIG. 2 shows the case for a resampling ratio 3/2, i.e. L=3 and M=2. The filter 102 comprises N=9 coefficients $h_n$ (reference numeral 201), with n=0, ..., N−1. The coefficients 201 are denoted as coefficients a, b, c, ..., I, respectively, in FIG. 2. The polyphase implementation comprises L=3 phases 121, denoted by the phase indexes 202 in FIG. 2.

The input samples 204 (i.e. the samples of the input audio signal 110) are shown in the first (left hand side) column of the table of FIG. 2 and are identified by the numbers 1, 2, 3, .... In the first column of the table of FIG. 2 two zero values are inserted between the input samples 204 because the input audio signal 110 is upsampled by a factor of L=3. The right hand side column of the table of FIG. 2 shows the output samples 203 (i.e. the samples of the output audio signal 113) which are identified by the numbers 1, 2, 3, .... One zero value is inserted between the output samples, because the signal is downsampled by a factor of M=2 (thereby indicating that the output of this line of the table is ignored). The values between the input samples 204 (on the left hand side of the table of FIG. 2) and the output samples 203 (on the right hand side of the table of FIG. 2) represent the filter delay line, which ensures that each input sample 204 is shifted by one to the right at each time step (from one line to the next line of the table). As such, each line of the table of FIG. 2 represents a snapshot of the status of the resampler 120 at a time instant of the upsampled sampling rate (i.e. the sampling rate of the input audio signal 101 multiplied by the upsampling factor L). The time-flow is from top to bottom of the table of FIG. 2 or, in other words, time increases from top to bottom of the table of FIG. 2.

It can be seen that for determining the full sequence of output samples 203 (which correspond to the numbers in the right hand side column of the table of FIG. 2, which are non-zero) only every second time step (i.e. every second line of the table) is considered and the following calculations are performed (wherein multiplications with "0" can be omitted): Output sample #1 to output sample #3 are not analyzed, as these output samples 203 correspond to the initialization phase of the resampler 120. Nevertheless, the findings of the present document also apply to these output samples 203. The output sample #4 is determined by 3*a+2*d+1*g (wherein the numbers represent the input samples 204), the output sample #5 is determined by 3*c+2*f+1*i (wherein the numbers represent the input samples 204) and the output sample #6 is determined by 4*b+3*e+2*h (wherein the numbers represent the input samples 204). Subsequent output samples 203 are determined in a recurring manner, i.e. output sample #7 is determined using the same coefficients as output sample #4, output sample #8 is determined using the same coefficients as output sample #5 and output sample #9 is determined using the same coefficients as output sample #6, and so on.

From the example of FIG. 2, it can be seen that only a subset of filter coefficients is used at a time instant to generate an output sample 203. That is, for output sample #4 the filter coefficients a, d, g, i.e. the filter coefficients of the first sub-filter 123 (i.e. $H_1(z)$), are used, for output sample #5 the filter coefficients c, f, i, i.e. the filter coefficients of the third sub-filter 123 (i.e. $H_3(z)$), are used, for output sample #6 the filter coefficients b, e, h, i.e. the filter coefficients of the second sub-filter 123 (i.e. $H_2(z)$), are used, and so on in a recurring manner.

As outlined above, each subset of filter coefficients, i.e. each sub-filter 123, may be referred to as a filter phase or phase 121. FIG. 2 shows the phase index l 202, wherein each subset of coefficients (i.e. each sub-filter 123) is related to a phase index 202. The sub-filter 123 of the phase 121 with the phase index l=1 comprises the filter coefficients a, d, g, the sub-filter 123 of the phase 121 with the phase index l=2 comprises the filter coefficients b, e, h, and the sub-filter 123 of the phase 121 with the phase index l=3 comprises the filter coefficients c, f, i. This is also shown by the above mentioned formula $H_l(z)=\sum_{n=0}^{N/L-1} h_{Ln+l-1} z^{-Ln}$, with l=1, ..., L.

It can be seen from the above analysis that from each output sample 203 to the next output sample 203, the phase index changes. For the example of a resampling ratio 3/2, the sequence of the phase index 202 is l=1, 3, 2, 1, 3, 2, ....

In general terms, the following observations can be made:
  Each output sample 203 is determined using a single sub-filter 123 ($H_l(z)$). In other words, each output sample 203 of the output audio signal 113 is determined using a single phase 121 of the polyphase implementation of the filter 102.
  The sub-filter 123 which is used to determine an output sample 203 is identified by a particular phase index 202 (l).
  The number of phase indexes 202 which are used to determine the output samples 203 of the output audio signal 103 is finite (typically the number of phase indexes 202 corresponds to the upsampling factor L).
  The sequence of phase indexes 202 for a sequence of output samples 203 is repetitive or periodic, i.e. the sequence of phase indexes 202 comprises sub-sequences which are repeated (in the above mentioned example, the sub-sequence 1, 3, 2 is repeated).
  Each sub-sequence (which is repeated periodically) comprises all the phases 121 or all the phase indexes l=1, ..., L of the total filter 102.
  The phase indexes 202 do not necessarily follow one another in an ascending order or in a sequential order. In particular, the phase indexes 202 of a sequence of phase indexes may jump from higher phase indexes to lower indexes and back to higher phase indexes again. This can be seen in the example of a 3/2 resampler, where the sequence of phase indexes for determining a sequence of output samples 203 is not l=1, 2, 3 but l=1, 3, 2).

From FIG. 2 it may be stipulated that the difference between two adjacent phase indexes of the sequence of phase indexes corresponds to M MOD L (for one or more pairs of adjacent phase indexes). In particular, the difference between a first phase index and a directly following phase index of the sequence of phase indexes may correspond to M MOD L, if the directly following phase index is greater than the first phase index and smaller or equal to the maximum phase index L. On the other hand, if the sum of the first phase index and M MOD L is greater than the maximum phase index L, then the phase index may wrap from the maximum phase index L to a smaller phase index, in the range of the minimum phase index 1 and the maximum phase index L.

When considering a different conversion ratio, e.g. 11/13 (i.e. L=11 and M=13), it can be seen that the sub-sequence of phase indexes for determining a sequence of output samples is given be l=1, 3, 5, 7, 9, 11, 2, 4, 6, 8, 10. This sub-sequence of phase indexes is repeated to form the total sequence of phase indexes.

In embedded systems it is desirable to know the sequence of phase indexes in advance before starting the filter calculations, i.e. it is desirable to know or to determine the sequence of phase indexes at initialization time. Calculating the sequence of phase indexes at initialization time and storing the sequence in an array provides the advantage of saving calculations for each output sample. Instead of calculating the phase index 202 for a particular output sample 203, the phase index 202 for the particular output sample 203 can be read from the pre-calculated array and a pointer to the corresponding sub-filter 123 can be set. Such a look-up operation is substantially more efficient that the calculation of the phase index 202 and/or the identification of the sub-filter 123 during runtime.

Figure 3:
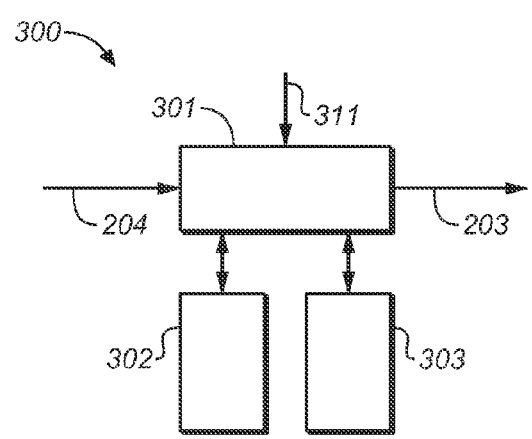
FIG. 3 shows a block diagram of an example resampling system.

FIG. 3 shows a block diagram of an example resampling system 300. The system 300 is configured to determine a sequence of output samples 203 (of the output audio signal 113) from a sequence of input samples 204 (of the input audio signal 110). The system 300 may be an embedded system, e.g. embedded into an audio encoder or audio decoder system. The system 300 may comprise a processing unit 301, e.g. a digital signal processor (DSP). The processing unit 301 may be configured to perform real-time processing of the input samples 204 and the output samples 203. In particular, the processing unit 301 may be configured to determine one or more output samples 203 of the output audio signal 113 from one or more input samples 204 of the input audio signal 110 (in real-time). The output samples 203 may be denoted as y[p], with p being the sample index (in accordance to the sampling rate of the output audio signal 113). The processing unit 301 may be configured to select a current phase index $l_p$ for determining the current output sample y[p]. The current phase index $l_p$ may be determined based on the preceding phase index that that has been used for the preceding output sample x[p−1] which directly precedes the current output sample y[p]. For determining the current phase index $l_p$, the processing unit 301 may refer to a pre-determined phase look-up table 302 (stored e.g. in a memory unit of the system 300). The pre-determined phase look-up table 302 may provide the current phase index $l_p$ based on (e.g. as a function of) the preceding phase index $l_{p-1}$.

The pre-determined phase look-up table 302 may reflect the sequence of phase indexes for a particular resampling ratio L/M. By way of example, for the resampling ratio 3/2, the phase look-up table 302 may have the form of Table 1. As can be seen from Table 1, the pre-determined phase look-up table 302 for a resampling ratio L/M typically comprises L entries. As such, the pre-determined phase look-up table 302 may be indicative of the sub-sequence of phase indexes which is repeated to form the sequence of phase indexes for determining the sequence of output samples 203 (i.e. for determining the output audio signal 113).

TABLE 1

| preceding phase index $l_{p-1}$ | current phase index $l_p$ |
|---|---|
| 1 | 3 |
| 2 | 1 |
| 3 | 2 |

The system 300 may comprise a plurality of phase look-up tables 302 for a plurality of different resampling ratios L/M. The resampling ratio L/M may be provided to the processing unit 301 as configuration data 311. The configuration data 311 may be indicative of the upsampling factor L and/or of the downsampling factor M. The processing unit 301 may then be configured to select the phase look-up table 302 which is indicative of the (sub-)sequence of index phases 202, which is to be used for the resampling ratio L/M given by the configuration data 311.

The system 300 may further comprise a filter look-up table 303 providing the sub-filter 123 which is to be used for determining the current output sample y[p]. In other words, the filter look-up table 303 may provide the one or more filter coefficients 201 which are to be applied to one or more corresponding input samples 204, respectively, in order to determine the current output sample y[p]. In yet other words, the filter look-up table 303 may provide the filter coefficients 201 of the sub-filter 123 for the different phase indexes l 202. Different sets of filter coefficients 201 may be provided for different phase indexes l. As such, the filter look-up table 303 may provide the current set of filter coefficients (to be used for determining the current output sample y[p]) based on the current phase index $l_p$. By way of example, for the resampling ratio 3/2 and for an anti-aliasing/anti-imaging filter 102 comprising a total of N=9 filter coefficients 201, the filter look-up table 303 may have the form of Table 2.

TABLE 2

| current phase index $l_p$ | current set of filter coefficients |
|---|---|
| 1 | $h_0 = a, h_3 = d, h_6 = g$ |
| 2 | $h_1 = b, h_4 = e, h_7 = h$ |
| 3 | $h_2 = c, h_5 = f, h_8 = i$ |

In a similar manner to the phase look-up table 302, the system 300 may comprise a plurality of filter look-up tables 303 for different upsampling factors L, for different downsampling factors M and/or for a different number N of filter coefficients 201. As indicated above, the configuration data 311 may be indicative of the up sampling factors L and/or of the downsampling factor M. Alternatively or in addition, the configuration data 311 may be indicative of the number N of filter coefficients to be used.

It should be noted that alternatively to using a phase look-up table 302 for determining the (sub-)sequence of index phases 202 and to then using a filter look-up table 303 for determining the one or more filter coefficients 201 which are to be used for the current phase, a combined phase/filter look-up table may be defined. The combined phase/filter look-up table may provide the filter coefficients 201 of the sub-filter 123 for the different phase indexes l 202 (similar to the filter look-up table 303), wherein the different phase indexes l 202 are ordered in accordance to the (sub-) sequence of index phases 202 (as given e.g. by the phase look-up table 302). Table 3 shows an example combined phase/filter look-up table for the resampling ratio 3/2 and for an anti-aliasing/anti-imaging filter 102 comprising a total of N=9 filter coefficients 201.

TABLE 3

| current phase index $l_p$ | current set of filter coefficients |
|---|---|
| 1 | $h_0 = a, h_3 = d, h_6 = g$ |
| 3 | $h_2 = c, h_5 = f, h_8 = i$ |
| 2 | $h_1 = b, h_4 = e, h_7 = h$ |

As a result of using a combined phase/filter look-up table which is ordered according to the (sub)sequence of phase indices, a MODULO L pointer may be incremented after computing the current output sample y[p], to look up the filter coefficients which are to be used for computing the next output sample y[p+1]. Hence, the filter coefficients for determining an output sample y[p] may be determined using only a single look-up operation.

As such, the system 300 may be configured to determine the set of filter coefficients which is to be used for determining the current output sample y[p] using computationally efficient look-up operations, e.g. using a phase look-up table 302 and/or a filter look-up table 303 and/or a combined phase/filter look-up table. The set of filter coefficients may comprise R filter coefficients, wherein R is typically equal to the ratio N/L (or to the nearest integer value thereof). The set of filter coefficients defines a sub-filter which is used to determine the current output sample y[p] from R input samples x[q] using the filter equation $y[p]=\sum_{r=0}^{R-1}\hat{h}_{R-r}x[q-r]$, wherein the filter coefficients $\hat{h}_r$, r=0, ..., R−1 form the set of filter coefficients for the current sub-filter 123. The filter coefficients $\hat{h}_r$, r=0, ..., R−1 correspond to a subset of the filter coefficients $h_n$, with n=0, ..., N−1, of the overall filter 102. Typically, the set of filter coefficients $\hat{h}_r$ for the phase 121 with the phase index l corresponds to $\hat{h}_r=h_{Lr+l}$, r=0, ..., R−1.

The relationship between the sample index p of the output audio signal 113 and the sample index q of the input audio signal 110 typically depends on the resampling ratio L/M. The one or more input samples 204 x[q−r], with r=0, ..., R−1, which are used to determine the output sample y[p] may typically be determined based on the relation $$p = \frac{L}{M}q.$$

The system 300 and in particular the processing unit 301 may be configured to determine the phase look-up table 302 and/or the repeated sub-sequence of phase indexes based on the upsampling factor L and based on the downsampling factor M. For this purpose, the system 300 and/or processing unit 301 may make use of a brute force approach. The method for determining the periodic sub-sequence of phase indexes may comprise generating a base vector comprising the ordered numbers [1; L], e.g. [1 2 3] for L=3. This base vector may be concatenated M times to yield a concatenated vector [[1; L] [1; L] ... ], e.g. the concatenated vector [[1 2 3] [1 2 3] ] for L=3 and M=2. Furthermore, the method may comprise the step of removing every $M^{th}$ entry of the concatenated vector. In the case of L=3 and M=2, the entries 2, 1, 3 (from left to right) are removed from the concatenated vector [[1 2 3] [1 2 3]] yielding the decimated vector [1 3 2]. The decimated vector corresponds to the sub-sequence of phase indexes, which is repeated to determine a sequence of output samples 203.

It should be noted that the above mentioned method for determining the to-be-repeated sub-sequence of phase indexes comprises the determination of a concatenated vector comprising L*M entries. This number may be quite large, e.g. for a sampling rate conversion of 48000 Hz to 44100 Hz, which corresponds to a ratio of L=147, M=160, the concatenated vector comprises 23520 entries. As such, the determination of the sub-sequence of phase indexes and/or of the phase look-up table 302 may make use of substantial memory resources. In view of this, a further method for determining the sub-sequence of phase indexes and/or for determining the phase look-up table 302 is described, which is more efficient regarding memory resources.

The method which is described below does not make use of a concatenated vector which needs to be stored in the memory of the system 300. The method is described in a pseudo-code manner in Table 4.

TABLE 4

Figure 4:
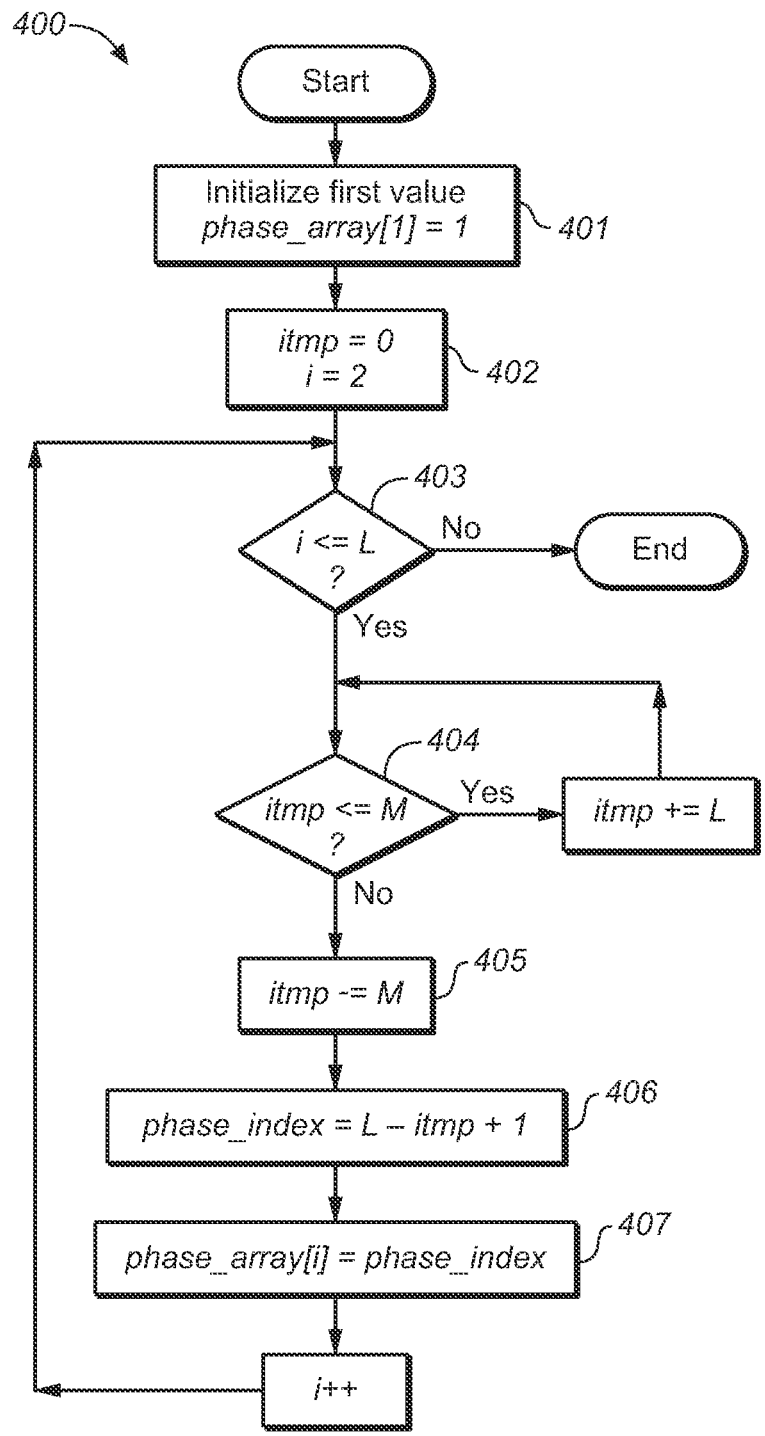
FIG. 4 shows a flow chart of an example method for determining a sequence of phase indexes.

Initialize a phase index vector with a first entry "1" (indicating the phase index l = 1)
Initialize a temporary variable itmp = 0
Loop over the upsampling factor L; from 2, ..., L
   while(itmp <= M) set itmp += L
   (i.e. increase itmp by L, until M is reached or exceeded)
   itmp −= M
   (i.e. decrease itmp by M)
   phase_index = L − itmp + 1
   (calculate a phase index)
   append the calculated phase_index as a new entry of the phase index vector FIG. 4 shows a flow chart of an example method 400 for determining the phase index vector "phase_array[i]" with i=1, ..., L. The example method 400 corresponds to the method shown in Table 4. The method 400 comprises the step 401 of selecting the phase index "1" as the first entry of the phase index vector. Furthermore, the method 400 comprises the step 402 of initializing an auxiliary variable itmp and a vector variable i. In step 403 it is verified whether the vector variable i is smaller or equal to L (i.e. whether the phase index vector has already been fully determined). In step 404, the auxiliary variable itmp is increased by steps of L, until the auxiliary variable itmp exceeds the downsampling factor M. In step 405, the auxiliary variable itmp is then decreased by M. The resulting auxiliary variable itmp may be used to determine the phase index for the $i^{th}$ entry in the phase index vector, i.e. phase_array[i] (steps 406 and 407). The steps 403 to 407 are then repeated for the next vector entry, up to the $L^{th}$ vector entry.

The method 400 for determining the phase index vector (which is indicative of the sub-sequence of phase indexes) is particularly efficient with regards to the memory which is required. Furthermore, the method is also computationally efficient, as it only makes use of additions and subtractions without the need for e.g. divisions or multiplications. This is particularly beneficial for embedded systems.

A further approach for determining the sub-sequence of phase indexes is given by the following formula:

$$P(i)=1+[M*(i-1) \text{MOD } L],$$

for i=1, 2, . . . L, wherein P(i) corresponds to the $i^{th}$ phase index of the sub-sequence of phase indexes. From the formula above, it can be seen that the difference between two adjacent phase indices may be Δ=[M MOD L], while taking into account that the phase index L is followed again by the phase index l (i.e. by taking into account the wrap around of the phase index at the maximum phase index L). In particular, the difference between two adjacent phase indices may be Δ=[M MOD L], except for the case where the phase index wraps from the maximum phase index L to a lower phase index.

A recursive formula for determining the sub-sequence of phase indexes may be given by:

$$P(i+1)=1+[P(i)-1+(M \text{ MOD } L)] \text{ MOD } L,$$

for i=1, 2, . . . L−1, wherein P(i) corresponds to the $i^{th}$ phase index of the sub-sequence of phase indexes and wherein e.g. P(1)=1.

It should be noted that the above mentioned methods for determining the sub-sequence of phase indexes and/or for determining the phase look-up table 302 are applicable to upsampling (L>M) and downsampling (L<M).

As such, the present document describes a resampling system 300 which is configured to resample an input audio signal 110 in a computationally and memory efficient manner. The system 300 may be configured to determine a sequence of phase-indexes (e.g. a phase look-up table 302) in a resource efficient manner. Furthermore, the system 300 may make use of one or more phase look-up tables 302 and/or of one or more filter look-up tables 303 to determine the current set of filter coefficients $\hat{h}_r$, r=0, . . . , R−1, which is to be used to determine the current sample y[p] of the output audio signal 113. As a result of such look-up operations, the computational complexity of the resampler 300 may be reduced.

In the following further aspects of an audio encoding and decoding system are described. These aspects are directed towards the phase relationship between the different channels of a multi-channel audio signal. Furthermore, these aspects are directed towards the design of audio bitstreams.

It is a typical use case for a multi-channel (e.g. a 5.1) audio signal to not be reproduced over five discrete audio speakers. Instead, the multi-channel audio signal may be mixed down to a reduced number of channels, e.g. to two (L/R) or three (L/C/R) channels, for reproduction or transmission. The downmix may be performed in the digital domain. Alternatively, the multi-channel audio signal may be fed to a so-called headphone virtualizer (also referred to as a binauralizer), which is configured to render the multi-channel audio signal in a virtual room environment over the headphone.

The downmix may be performed by an audio decoder (as part of the decoder processing), which may be placed within a settop box (STB). The downmixing process may make use of so called matrix encoding. The audio decoder (e.g. the STB) may then provide the downmixed audio signal to the actual reproduction device (e.g. the Audio/Video Receiver, AVR), wherein the link between the audio decoder and the actual reproduction device may be limited to a reduced number of channels. It should be noted that at the point of downmixing (e.g. at the audio decoder), no detailed information about the actual playback configuration may be available.

It may occur that the actual reproduction device has sufficient speakers or contains a headphone virtualizer with sufficient channel inputs, in order to render the full multi-channel audio signal. In this case, the actual reproduction device may perform a matrix upmixing process (also referred to as a matrix decoding process) from the downmixed audio signal to a multi-channel audio signal. Examples for such upmixing schemes are the Dolby Surround, the Dolby Prologic, or the Dolby Prologic II upmixing schemes.

Figure 5A:
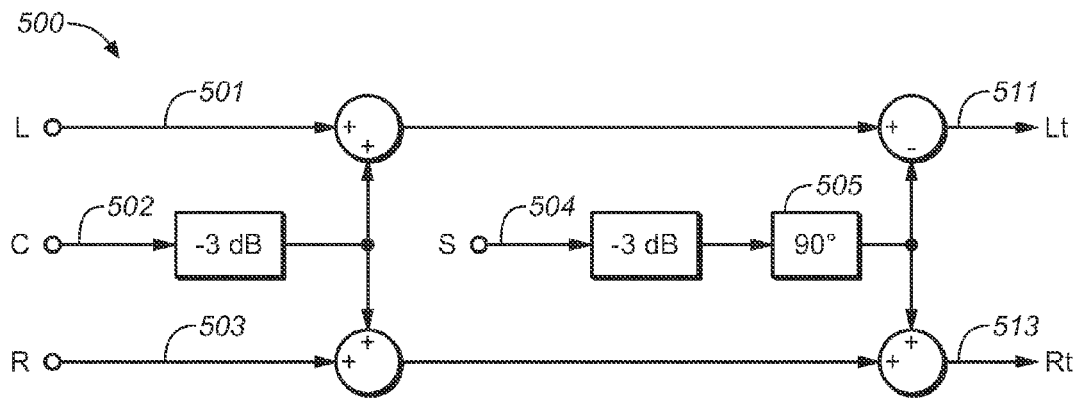
FIG. 5a shows a block diagram of an example downmixing system.

FIG. 5a shows an example downmixing system 500 which is configured to downmix four original source audio signals (also referred to as the channels of a multi-channel audio signal) to a two channel audio signal. The original audio signal comprises a left (L) channel 501, a right (R) channel 503, a center (C) channel 502 and a surround (S) channel 504. The downmixed audio signal comprises a left-total (Lt) channel 511 and a right-total (Rt) channel 513. The term "total" indicates that the channels of the downmixed audio signal also comprise information from one or more other channels (not just from the left and/or right channel, respectively).

In the case of FIG. 5a, there are four "cardinal" input signals or input channels: Left 501, Center 502, Right 503, and Surround 504 (L, C, R, S). The L and R inputs are directly provided to the Lt and Rt downmix outputs, respectively, without modification. The C input is divided equally to the Lt and Rt downmix outputs, e.g. with a 3 dB level reduction in order to maintain constant acoustic power in the downmix signal (compared to the original input signal). The S input may also be reduced by 3 dB, but before being divided equally between the Lt and Rt downmix outputs, the signal may be applied with a 90 degrees phase shift relative to L, C, and R (using the phase shift unit 505). This may be beneficial for the identification of the surround channel 504 within the downmix channels Lt, Rt 511, 512. Furthermore, the S signal 504 may be carried in the Lt/Rt channels with opposite polarities, respectively. This is implemented by the "−" sign in the summing stage feeding the Lt output.

Figure 5B:
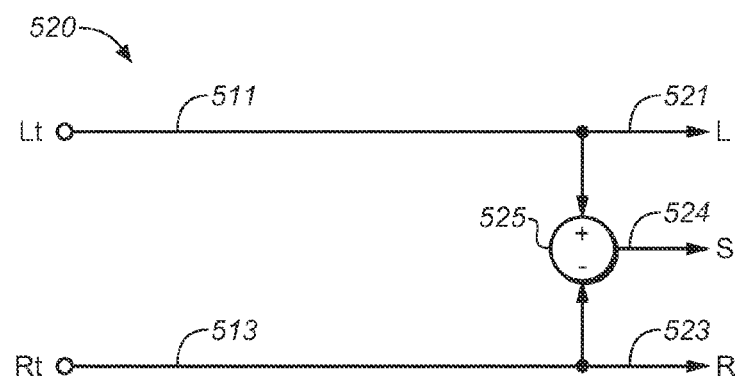
FIG. 5b shows a block diagram of an example upmixing system.

FIG. 5b shows an example upmixing system 520 which is configured to generate a surround (S) channel 524, as well as a left (L) channel 521 and a right (R) channel 523 from the downmix channels 511, 512. For this purpose, the upmixing system 520 is configured to subtract the Rt signal 513 from the Lt signal 511 using a subtraction unit 555. In the example of FIG. 5b, the left (L) channel 521 and the right (R) channel 523 correspond to the Lt channel 511 and the Rt channel 513, respectively.

It can be seen that if only an S signal 504 (and no C signal 502 and no L, R signals 501, 503) is present at the downmixing system 500, the signals in Lt and Rt are identical, but of opposite polarity. When these signals are subtracted in the upmixing system 520, the signals 511, 513 create the surround output signal 524 as desired (being identical to the original surround signal 504, with a 90 degree phase shift). Furthermore, if only a C input signal 502 (and no S signal 504 and no L, R signals 501, 503) is present at the downmixing system 500, the C components in Lt and Rt are identical. When subtracted in the upmixing system 520, the C components cancel each other completely, leaving only silence at the S output, which is again the desired result. This shows that a high channel separation between C and S channels may be achieved. However, if the Lt and Rt signals are random (and not purely comprising the C or S signals), the subtraction unit 525 of the upmixing system 520 produces a difference signal at the S output 524. As a result, the original channels cannot be separated in a perfect manner anymore. The channel separation between front and surround signals can be as low as 3 dB.

The imperfect separation of the original channels of a multi-channel signal can partly be overcome by a suitable matrix encoding (or downmixing) process (e.g. Dolby Surround encoding). As shown in the context of FIG. 5a a downmix, e.g. a downmix from 3/2 to 2/0 or from 3/1 to 2/0, typically involves a 90 degree phase shift 505 on the surround channels 504 before (or during) the matrix encoding (or downmixing) process.

Given the above infrastructure constraints, and looking at the mastering stage of 5.1 material (i.e. when encoding the audio data for storage on e.g. DVD or BluRay or for broadcast transmission), it is usually not known whether a multi-channel audio signal will be reproduced 'natively' over a sufficient number of speakers, or whether the multi-channel audio signal will be downmixed using a matrix encoding process (as illustrated e.g. in FIG. 5a), which may be followed by a matrix decoding process (as illustrated e.g. in FIG. 5b).

Figure 5C:
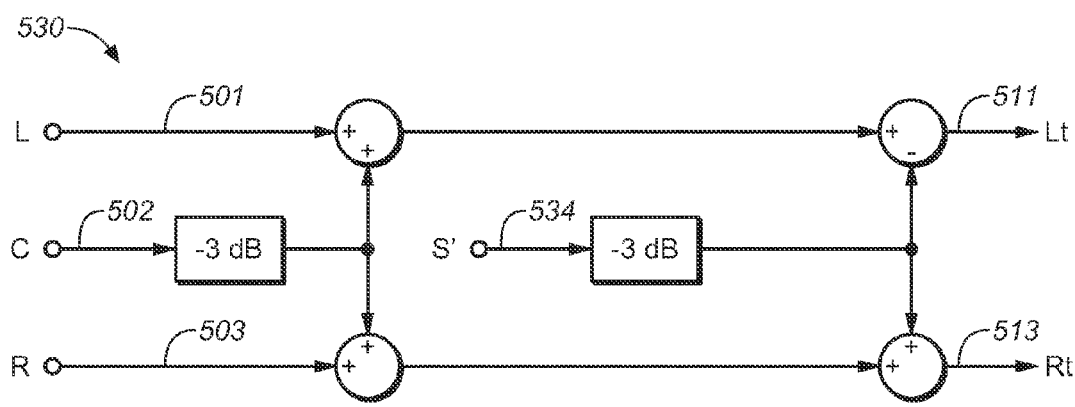
FIG. 5c shows a block diagram of another example downmixing system.

Due to the benefits of a 90 degree phase shift 505 for channel separation, it has become common to anticipate the above mentioned 90 degree phase shift 505 of the matrix encode system 500 by applying a 90 degree phase shift already in the mastering stage before encoding the multi-channel audio signal. As a result, already the coded discrete multi-channel audio signal carries a 90 degree phase shift in the one or more surround channels 504. By consequence, a matrix encode system should not comprise a phase shift unit 505, in order to avoid the 90 degree phase shift from being applied twice. Such a matrix encode or downmixing system 530 is illustrated in FIG. 5c. It can be seen that the matrix encode system 530 receives a modified surround (S') channel 534 which is 90 degrees phase shifted with respect to the surround (S) channel 504 received by system 500 of FIG. 5a.

The approach of providing a multi-channel audio signal which already comprises one or more 90 degrees phase shifted surround channels has proven to degrade the reproduction of the audio signal in a full multi-channel setup only minimally, while at the same time improving channel separation in case of matrix encoding and decoding. However, the approach of providing such a phase shifted multi-channel audio signal bears the risk that in case the matrix encoding stage 500 is not aware of the already shifted surround channels 504, the encoding stage 500 might apply a further 90 degrees phase shift to the one or more surround channels 504. For content of the surround channels 504 which is in-phase with content from the front channels 501, 503, this means that undesired signal cancellation may occur (due to a total 180 degrees phase shift). Such signal cancellation may also occur in the case where a multi-channel signal is not matrix encoded, but is re-encoded in a discrete manner using an encoder that also applies a 90 degree phase shift to the one or more surround channels 504. Furthermore, the effect of using phase-shifted surround channels in headphone virtualizers is not explored and may lead to suboptimal binauralization results.

In order to address the above mentioned shortcomings, it is proposed to always omit a 90 degree phase shift in audio encoders (i.e. when generating the multi-channel audio signal), so as to provide a (non-phase shifted) multi-channel audio signal. Instead, the 90 degree phase shift should be performed in the corresponding audio decoders. The application of a 90 degree phase shift should be performed subject to one or more conditions which should be fulfilled (i.e. true). The conditions may comprise:

a first condition indicating that the audio decoder performs a matrix downmix process after (or during) the decoding of the audio signal; and/or a second condition indicating that the multi-channel signal is not signaled (i.e. is not identified) as having been phase-shifted before (e.g. in during the encoding of the multi-channel audio signal).

In other words, it is proposed to omit the 90 degree phase processing within an audio encoder (when generating the multi-channel audio signal).

to enable the audio encoder to convey the information regarding a phase shift to the corresponding audio decoder within the bitstream, if it is determined that the one or more surround channels of the multi-channel audio signal have already been 90 degrees phase shifted.

that in case the audio encoder does not have a-priori-information regarding the possible phase shifting of the surround channels of the multi-channel audio signal, the audio encoder may be configured to perform a signal analysis of the multi-channel audio signal to derive a probability of whether the multi-channel audio signal comprises one or more 90 degree phase shifted surround channels or not.

that the audio decoder may be configured to perform the 90 degree phase shift, if it is determined that the above mentioned conditions are met.

As indicated above, the present document also addresses various aspects regarding a bitstream which is transmitted from an audio encoder to a corresponding audio decoder. The bitstream typically comprises audio data which is indicative of the to-be-rendered audio signal. Furthermore, the bitstream typically comprises metadata which provides information to the audio decoder on how the audio signal is to be rendered.

The bitstream is typically structured into a sequence of frames (also referred to as a sequence of access units). The bitstream structure of an audio coding system is preferably designed in a way to facilitate manipulation of the data which is comprised within the bitstream directly on the level of the bitstream (preferably without having to decode the audio data). In general, a frame of the bitstream may comprise a multiplex of different substreams. The different substreams may e.g. be related to different languages of an audio program (e.g. to different audio tracks for a video in different languages). Alternatively or in addition, the different substreams may be related to the same audio data at different bit-rates. It is desirable that the different substreams of the overall bitstream can be identified, stripped out, or merged into the overall bitstream on a relatively high level (without the need for decoding the substreams). Providing means for identifying, extracting and/or inserting substreams into an overall bitstream facilitates applications such as adaptive streaming, where a particular one of a plurality of different bit-rate representations of audio content is dynamically selected from a multiplex of different bit-rate representations, which may potentially be stored in one multiplex.

In the present document, it is proposed to provide the bitstream with information on the different substreams which are comprised within the bitstream. As indicated above, the bitstream structure allows to store different representations of audio content inside one multiplexed bitstream, in a manner that each bitstream frame contains the same signal (in time) several times, wherein the same signal is encoded in different channel modes and/or at different bit-rates. By way of example, the same content may be provided as a 2-channel and a 5.1-channel representation, and/or the same content may be provided at different bit-rates corresponding to different audio quality.

Figure 6A:
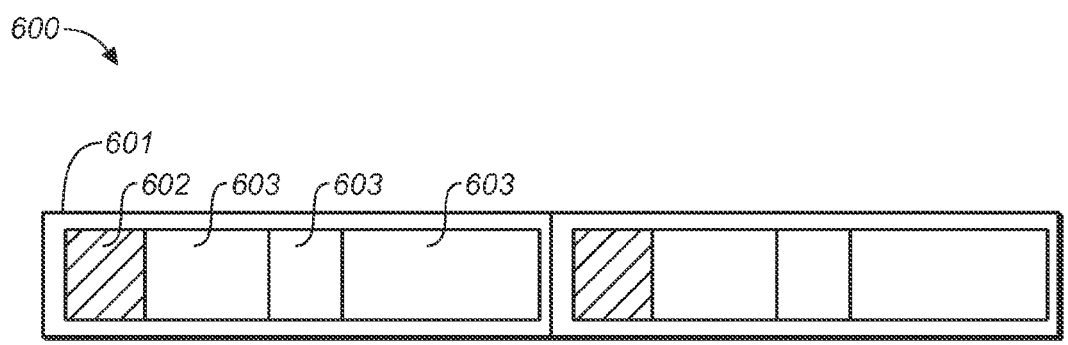
FIG. 6a illustrates the structure of an example audio bitstream comprising a plurality of access units.

FIG. 6a shows an example bitstream 600 comprising a sequence of frames (or access units) 601. Each frame 601 comprises a plurality of substream frames 603 which may comprise different representations of the same audio content. The different representations may relate e.g. to different channel configurations (e.g. to a 2 channel configuration and/or to a 5.1 channel configuration) and/or to different bit-rates. Furthermore, the frame 601 comprises control information 602 which provides an inventory of the plurality of substream frames 603 comprised within the multiplexed frame 601. The control information 602 may comprise information describing the different representations and/or information identifying the location of the substream frames 603 within the frame 601.

Using the bitstream structure shown in FIG. 6a, an adaptive streaming server may be enabled to de-multiplex in real-time (i.e. on the fly) a particular one of the plurality of representations, e.g. a particular representation which is suitable for transmission over a streaming channel at a particular point in time. This may be useful because the streaming bandwidth of the streaming channel may vary largely over time. In view of the fact that the control information 602 comprises sufficient information to identify an appropriate representation of the audio content (i.e. to identify an appropriate substream frame 603) without the need for decoding the substream frames 603, the de-multiplexing of the particular substream can be performed at relatively low computational cost.

As such, it is proposed to provide a bitstream which comprises a plurality of different substreams for different representations of the same audio content with a bitstream inventory 602 that holds information about the channel mode and/or the bit-rate of some or all of the substream frames 603 comprised within a multiplexed frame 601. The provision of such a bitstream inventory 602 enables dynamic decisions on which representation to choose and to stream out, as requested by a streaming client. Using appropriate coding formats, the control information 602 can be designed to require only a limited signaling overhead.

Possible manipulations on the level of the bitstream 600 comprise the assembly and the disassembly of multiplexed bitstreams 600 comprising a plurality of substreams. In particular, the manipulations comprise the addition and the removal of substreams to/from a pre-existing bitstream 600. The provision of control information 603 simplifies such additions and/or removals of substreams.

Such manipulations are desirable e.g. in broadcast situations, where a multiplexed bitstream comprising different qualities of the same audio content is stored on a server or transmitted in-house to a broadcast facility. At the point of playout, it can be decided which version of the audio content comprised within the multiplexed bitstream 600 is used for one or several distribution links (e.g. digital terrestrial TV, satellite, internet streaming). Different distribution links may have different bit-rate constraints and may therefore require the use of different representations of the audio content (i.e. the use of a different substream of the multiplexed bitstream 600).

The provision of control information 602 allows for a resource efficient identification of the different substreams, and for the extraction of one or several desired substreams from the multiplexed bitstream 600. Subsequent to extraction of the substream, the extracted substream may be converted into a new valid bitstream 600, wherein the new valid bitstream 600 comprises a subset (e.g. one or more) of the different representations of the audio content.

The control information 602 may be created, read and/or interpreted using a set of rules. The control information 602 may provide a Table of Content (ToC) of the substream frames 603 comprised within a multiplexed frame 601. An example method for extracting a substream from the multiplexed bitstream 600 and for re-inserting the extracted substream into a separate new bitstream comprises:

for each frame 601 of the multiplexed bitstream 600, reading the control information 602;
from the control information 602, identifying which portion 603 of the frame 601 corresponds to the to-be-extracted substream;
copying or extracting the identified portion 603 of the frame 601 into an outgoing bitstream;
repeating the identifying and copying steps for all frames 601 of the bitstream 600, which comprise substream frames 603 of the substream which is to be extracted;
generating control information 602 for the outgoing bitstream, wherein the control information 602 only refers to the extracted bitstream portions;
concatenating the generated control information 602 with the extracted bitstream portions 603, to form frames 601 of the outgoing bitstream.

The control information or ToC 602 may comprise information regarding the representation of the audio content (such as the channel count and/or the bit-rate). Alternatively or in addition, the control information 602 may comprise information on the language of the audio content and/or on main/associate audio relations. By way of example, a multiplexed bitstream 600 may comprise a pair of substreams related to a main and an associated audio signal. The associated audio signal may e.g. comprise a director's comment, or a scene description for a TV program for blind/visually impaired viewers. A consumer may choose whether he wants to listen to the main track only, or whether he wants to listen to a mix of the main and associate signals. The identification of a signal being a main signal, and/or the identification of a signal being an associated signal, and/or what purpose the associated signal serves, and/or to which main signal the associated signal refers, may be part of the ToC 602.

As indicated above, a bitstream 600 typically comprises metadata and/or control information in addition to encoded audio data. This data may be referred to as side information. Such side information (e.g. the control information 602) is typically encoded using a variable rate encoder, in order to increase the coding or bit-rate efficiency. A typical approach to such variable rate coding is to analyze the redundancy and statistics of the data and to code frequently appearing data words by shorter code words and less frequently appearing data words by longer code words, thus providing a representation of the data which is shorter in average without losing data. An example of such a coding technique is a Huffman code.

In contrast to the above, it is proposed in the present document to use shorter code words for encoding the side information in cases, where the expected overall bit-rate of the associated substream is smaller. In other words, the variable rate coding of the side information may be dependent on the bit-rate of the audio data that the side information is associated with. In particular, the control information 602 of the frames 601 of the multiplexed bitstream 600 may be encoded using a variable length code, wherein the length of the code words which are used to encode the control information 602 for the different substreams depends on the bit-rate of the different substreams. Typically, the length of the code words increases with the bit-rate of the substreams.

By way of example, in order to code the channel configuration of the different substreams of a multiplexed bitstream 600, the following code word table (Table 5) may be used:

TABLE 5

| Mono | 0 |
|---|---|
| Stereo | 10 |
| 5.0 | 110 |
| 5.1 | 111 |

In the example of Table 5, four different channel configurations (or channel modes) are possible, which could be identified using 2 bits. In the present document, it is proposed to use for the mono case, for which the overall bit-rate of the associated substream is relatively low, a shorter code word (e.g. a 1 bit code word) than for the 5.1 multi-channel case, for which the overall bit-rate of the associated substream is higher than for the mono case. For the 5.1 multi-channel case, the channel configuration is coded with a 3 bit code word. Due to the increased bit-rate of the 5.1 multi-channel substream (compared to the mono substream), the relative overhead used for the control information 602 may not be higher than for the mono substream. Overall, a variable length encoding of the control information 602 based on the bit-rate of the associated audio data allows achieving a more adequate usage of the required control information overhead relative to the overall bit-rate. In other words, the variable length encoding scheme described in the present document allows equalizing the relative control information overhead (relative with respect to the bit-rate of the associated audio data) for the plurality of different substreams.

A further issue which is encountered in the context of broadcasting of audio bitstreams is the splicing of bitstreams. The splicing of different bitstreams may occur e.g. as the result of a program change within a running bitstream, as the result of an interruption of a program by an advertisement ("Ad insert") and/or as the result of a user switching to a different program.

The splicing points between different programs or audio signals may be signaled on a high level within the bitstream (e.g. in the Program Map Tables, PMTs, of an MPEG-2 Transport stream). However, the information regarding the splicing points within the bitstream may not be available to the core audio decoder of a decoding device (such as a television, TV, and/or a settop box, STB). Even if the information regarding the splicing points is available at the decoding device, it may not be possible to convey the information regarding the splicing point to the decoding device at the accuracy of a particular splicing frame. Furthermore, the information regarding the splicing point is not always set correctly on the broadcasting headend.

As a consequence, the audio decoder may not be aware of a situation where a to-be-decoded frame of the received bitstream does not correspond to the same stream of audio data as the previously received frame of the received bitstream. In other words, the audio decoder may not be aware of a discontinuity within the bitstream between a previously received frame and a currently (to-be-decoded) frame. Such a discontinuity may lead to a loss of parameters which are required for an authentic decoding of the audio data.

Many audio coding algorithms (such as High Efficiency-Advanced Audio Coding, HE-AAC and Unified Speech and Audio Coding, USAC) usually do not transmit all necessary information for decoding an encoded frame within each individual encoded frame. For bit-rate efficiency, some information may only be transmitted occasionally (e.g. in a periodic manner). The frame header information is typically not changing on a frame-by-frame basis, and an encoder may set the header information to be constant for a given bit-rate and/or for a given channel configuration. As a consequence, subject to a discontinuity, the audio decoder may not be aware of the header information which is required for correctly decoding the to-be-decoded frame.

A further aspect is the usage of encoding techniques that explicitly rely on past information within the decoding process. These encoding techniques are directed at providing bit-rate savings by exploring commonalities in adjacent frames. Examples of such encoding techniques are cross-frame-delta encoding of parameters and the use of inter-frame prediction techniques.

As a result of such inter-dependencies, when an audio decoder receives a spliced bitstream, the fact that parameters may have changed at the splicing point may remain unnoticed. In consequence, the audio decoder may be driven to undefined conditions and/or may produce audible audio artifacts. This is particularly the case, when at least some high-level bitstream parameters (like e.g. the number of channels or the audio sampling frequency) remain unchanged before and after the splicing point, while other (more specific) parameters change.

In the present document, it is proposed to introduce a sequence counter per frame as part of the bitstream. In regular operation, subsequent audio frames are provided with increasing sequence counter numbers. A wrap-around (e.g. a reset to one) may be applied when the resolution of the counter is exhausted. The sequence counter enables the audio decoder to detect the fact that the sequence counter is not increased by 1 (or by a pre-determined amount) in two subsequent frames. A discontinuity of the sequence counter may be interpreted by the audio decoder as a discontinuity of the bitstream (caused e.g. by a splicing point). As a result, the audio decoder may be configured to detect a splicing point within the bitstream using the sequence counter.

In particular, the audio decoder may be configured to suppress the decoding of the to-be-decoded frame (subsequent to the detected splicing point) based on one or more decoded frames (preceding the detected splicing point). Furthermore, the audio decoder may be configured to suppress decoding of the to-be-decoded frame, which relies on header information that is associated with one or more frames preceding the detected splicing point. By way of example, the audio decoder may be configured to only resume decoding (subsequent to a detected splicing point) upon reception of the correct header information and/or upon reception of an independently encoded frame (e.g. of a so called I frame). By doing this, the occurrence of audible artifacts caused by unnoticed splicing points can be reduced.

As indicated above, the sequence counter typically has a limited resolution and so "false positives" (i.e. false detections of a splicing point) may occur with a certain probability. However, the probability of "false positives" may be controlled by the length or resolution of the sequence counter.

A specific value, e.g. the value "0", of the sequence counter may be reserved for a specific purpose. This specific value may take on the function of a splice marker. The meaning of a frame which comprises this particular sequence counter value may be:
- to indicate that there is a splicing point between the current frame (comprising the particular sequence counter value) and the previous frame.
- to indicate that a possible discontinuity of the sequence counter having the particular sequence counter value and the directly following sequence counter should be ignored. In other words, even if the next sequence counter would indicate a splicing point (due to a discontinuity), this indication of a splicing point should be ignored.

The definition of a splicer marker allows a splicing device at a broadcasting headend to mark a splicing point on-the-fly by means of a comparably simple modification of the sequence counter, i.e. by setting the sequence counter to the specific value. This marking process works especially well, when the sequence counter is stored at an easy-to-identify position, preferably close to the beginning, of a frame.

Figure 6B:
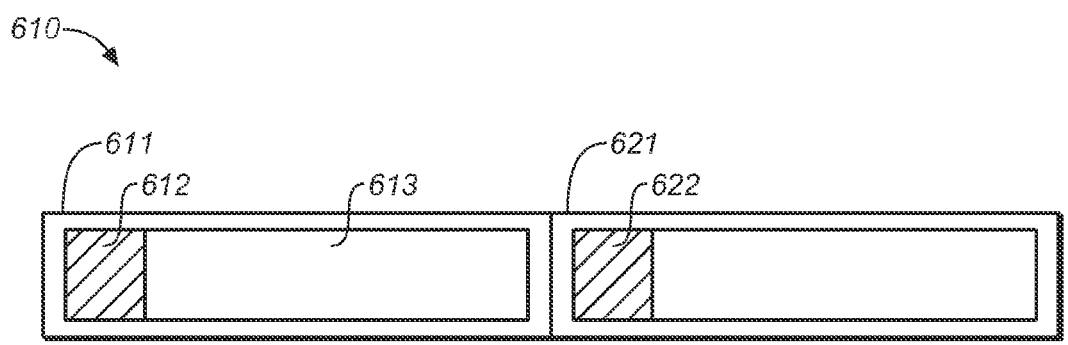
FIG. 6b illustrates the structure of another example audio bitstream comprising a plurality of access units.

FIG. 6b shows an example bitstream 610 comprising a sequence of frames 611, 621. The frames 611, 621 comprise encoded audio data 613. Furthermore, the audio frames 611, 621 comprise respective sequence counters 612, 622. Directly succeeding sequence counters 612, 622 within directly succeeding frames 611, 621 may indicate to an audio decoder that the directly succeeding frames 611, 621 relate to continuous audio data. On the other hand, a discontinuity of succeeding sequence counters 612, 622 may indicate a discontinuity of the audio data (e.g. caused by a splicing point). Alternatively or in addition, a particular value (e.g. the value "0") of the sequence counter 622 may indicate a splicing point between the frames 611 and 621.

As indicated above, the sequence counters 612, 622 may be used to identify the presence of a slice point. The sequence counters 612, 622 may cycle periodically (in an ascending or descending sequential order) between a minimum value $Q_{min}$ and a maximum value $Q_{max}$. An example value for the minimum value is $Q_{min}=1$ and for the maximum value is $Q_{max}=1020$. If the value $q_1=n$ of the sequence counter 612 of a current frame 611 directly precedes the value $q_2$ of the sequence counter 622 of the directly following frame 621 within the bitstream 610, such that e.g. $q_2=n+1$ or $q_2=n \bmod Q_{max}+Q_{min}$, the values $q_1$ and $q_2$ of the sequence counters 612 and 622 indicate that there is no splicing point within the bitstream 610. On the other hand, if the value $q_2$ of the sequence counter 622 of the frame 621 does not directly follow the value $q_1$ of the sequence counter 612 of the frame 611, e.g. $q_2 \neq n+1$ or $q_2 \neq n \bmod Q_{max}+Q_{min}$, this may provide an indication for the presence of a splicing point within the bitstream 610 between the current frame 611 and the directly succeeding frame 621.

On the other hand, a change of the frame rate of the frames 611, 621 within the bitstream 610 may occur. By way of example, a user may request the same audio signal at a different frame rate, e.g. in order to improve the quality of the audio signal and/or in order to adapt the bitstream 610 to the available bandwidth of a transmission medium. By way of example, the bitstream 610 may comprise a first sequence of frames 611 at a first frame rate N and a second sequence of frames 621 at a second frame rate K. The ratio K/N of the first and second frame rates may be an integer or a rational number. In particular, the ratio of the first and second frame rates may be $$\frac{K}{N} = 1/4, 1/2, 2, \text{ or } 4.$$

In other words, the first and second frames rates may be integer multiples of a base frame rate.

As indicated above, the values $q_1$, $q_2$ of the sequence counter of consecutive frames 611, 621 should be consecutive as well. If the values $q_1$, $q_2$ are not consecutive, this may be an indication for a splice point (also referred to as a splicing point). In particular, a bitstream decoding system may be configured to evaluate the values of the sequence counter and to send a Splice Detected message, which may be timed to the nominal beginning of the frame 622 when the counter value jumps or exhibits a pre-determined value (e.g. zero). Typically, a sequence counter jump from 0 to any other number does not indicate a splice. A jump from 0 to 0 may indicate a further splice point.

However, the modification of the frame rate may lead to a change of the value q of a sequence counter of a frame. In particular, if the frame rate changes by a factor ¼, ½, 2, 4, a discontinuity of the counter values of directly following frames 611, 621 may not necessarily be due to a splice of the bitstream 610. Such changes of the value q of a sequence counter may be due to the fact that the counting speed, i.e. the speed at which the sequence counter is modified, may depend on the frame rate. By way of example, in case of a basic frame rate, the sequence counter may have the value 4 for the fourth frame. On the other hand, in case of a frame rate which is twice the basis frame rate, the sequence counter may already have the value 8 for the frame which corresponds the same temporal excerpt of an audio signal as the fourth frame at the basis frame rate. Hence, a change of the frame rate may lead to a discontinuity of the value of the sequence counter.

Table 6a provides formulas for determining a target sequence counter value $\tilde{k}$ for the sequence counter 612 of the frame 611 (assuming the second frame rate K) based on the sequence counter value $q_1=n$ of the sequence counter 612 of the frame 611 (at the first frame rate N). The formulas are shown in Table 6a for the case $Q_{max}=1020$.

TABLE 6a

| Frame Rate Ratio | Allowed Sequence Counter Jumps |
|---|---|
| K/N = 2 | $\tilde{k} = 2(((n-1) \bmod 510) + 1); n \in \mathbb{N}^*$ |
| K/N = ½ | $\tilde{k} = \frac{1}{2}(((n-1) \bmod 1020) + 1) + (m \cdot 510);$ |
|  | $n = 2s; s \in \mathbb{N}^*; m \in \{0, 1\}$ |
| K/N = 4 | $\tilde{k} = 4(((n-1) \bmod 255) + 1); n \in \mathbb{N}^*$ |
| K/N = ¼ | $\tilde{k} = \frac{1}{4}(((n-1) \bmod 2040) + 1) + (m \cdot 255);$ |
|  | $n = 4s; s \in \mathbb{N}^*; m \in \{0, 1, 2, 3\}$ |

Table 6b provides the formulas in more general terms for arbitrary values of $Q_{max}$.

TABLE 6b

| Frame Rate Ratio | Allowed Sequence Counter Jumps |
|---|---|
| K/N = 2 | $\tilde{k} = 2(((n - 1) \bmod Q_{max}/2) + 1)$ ; $n \in \mathbb{N}^*$ |
| K/N = ½ | $\tilde{k} = \frac{1}{2}(((n - 1) \bmod Q_{max}) + 1) + (m \cdot Q_{max}/2)$; $n = 2s$; $s \in \mathbb{N}^*$; $m \in \{0, 1\}$ |
| K/N = 4 | $\tilde{k} = 4(((n - 1) \bmod Q_{max}/4) + 1)$; $n \in \mathbb{N}^*$ |
| K/N = ¼ | $\tilde{k} = \frac{1}{4}(((n - 1) \bmod 2 \cdot Q_{max}) + 1) + (m \cdot Q_{max}/4)$; $n = 4s$; $s \in \mathbb{N}^*$; $m \in \{0, 1, 2, 3\}$ |

If the actual value $q_2$ of the sequence counter 622 of frame 621 is equal to the target sequence counter value $\tilde{k}+1$ for the sequence counter 622, in particular $q_2=(\tilde{k}+1) \bmod Q_{max}$, the bitstream 610 does not comprise a splicing point between the frames 611 and 621 (but only a change of the frame rate). In this case, the decoding system may be configured to not provide a Splice Detect message (even though a discontinuity of the values of the sequence counters 612, 622 has been detected). On the other hand, if the actual value $q_2$ of the sequence counter 622 of frame 621 differs from the target sequence counter value $\tilde{k}+1$ (or more precisely $(\tilde{k}+1) \bmod Q_{max}$) for the sequence counter 622, i.e. $q_2 \neq (\tilde{k}+1) \bmod Q_{max}$, the bitstream 610 comprises a splicing point between the frames 611 and 621 (in addition to a change of the frame rate). In such a case, a Splice Detect message may be provided.

It should be noted that, alternatively or in addition, a target sequence counter value k of the sequence counter 622 of frame 621 (with e.g. k=($\tilde{k}+1$) mod $Q_{max}$) may be calculated directly from the value $q_1$ of the sequence counter 612 of the frame 611, as outlined above and/or in the claims. In such a case, the target sequence counter value k of the sequence counter 622 of frame 621 may be compared directly with the actual value $q_2$ of the sequence counter 622 of frame 621, in order to determine whether a transition point between the first and the second sequence is a splicing point or not.

As such, the decoding system may be configured to take into account the fact that as a result of a change of the frame rate, the sequence counters 612, 622 of the frames may differ by a factor which corresponds to (or depends on) the ratio K/N of the second and first frame rates. By doing this, a seamless switching of the frame rate may be provided (without degradation of the audio quality due to the false detection of a splicing point).

The frame rate of a sequence of frames within the bitstream 610 may be a rational number. Alternatively or in addition, the average length of the frames of the bitstream 610 may be fractional or may be rational numbers. In order to implement such fractional frame rates and/or frame lengths, the length of the frames may vary within the bitstream 610.

By way of example, the frame rates 29.97, 59.94 and 119.88 fps (frames per second) may result in the fractional external frame lengths of 1601.6, 800.8 and 400.4 samples, respectively. A sample rate converter may provide such fractional frames by providing longer and shorter frames within a subsequence, such that in average the fractional external frame length is provided. After a pre-determined number Z of frames, e.g. Z=5, the subsequence may be repeated. In other words, a sample rate converter or an encoding system may be configured to go through Z different frame length within a subsequence. In order to produce the same sample output from bitstream 610, e.g. from an AC-4 stream, independent from the start of the decoding within the bitstream, the phase of the sample rate converter may be bound to the bitstream 610.

As indicated above and as illustrated in Table 7, an encoding system and/or a sample rate conversion system may generate frames with different frame lengths, in order to provide a sequence of frames which has a fractional average frame length. A certain pattern or suite of frame lengths may be repeated (as a subsequence), wherein the average of the frame lengths of the suite of frame lengths corresponds to the fractional average frame length. The position within the suite of frame lengths may be referred to as a phase of the bitstream 610. An encoding system and/or a rate conversion system may be configured to "lock" the phase of the bitstream 610, even at splicing points and/or rate conversion points. In particular, this may be achieved by locking the phase of the sample rate converter or the encoding device to a so called sequence index.

The sequence index may be calculated based on the sequence counter. In particular, the sequence index may be calculated using the formula:

sequence_index=sequence_counter mod Z, wherein sequence_index is the value of the sequence index of a particular frame (which is indicative of the phase of the frame) and wherein sequence_counter is the value of the sequence counter of the particular frame.

It should be noted that the number of phases Z may depend on the relation between the internal frame length and its corresponding external frame length, i.e. the number of phases Z may depend on the resampling ratio. Alternatively or in addition, the number of phases Z may depend on the different frame rates, i.e. on the sizes of the internal frame lengths and their corresponding external frame lengths.

Typically, the sampling rate of an audio signal is fixed to a pre-determined external sampling rate (e.g. 48 kHz). In order to allow for fractional external frame lengths or frame rates, a sample rate conversion may be required (as outlined in the present document), in order to adapt the audio signal to meet a pre-determined internal frame length. The internal frame length is typically fixed. Furthermore, the internal frame length may depend on the signal processing which is performed. By way of example, the signal processing may comprise a QMF (Quadrature Mirror Filterbank) analysis/synthesis, e.g. a 64 subband QMF analysis/synthesis. The internal frame length may depend on such signal processing constraints, e.g. the internal frame length may be a multiple of 64 (as is the case for the example shown in Table 7). In order to transform an audio signal from the external frame length (which may be variable) to the internal frame length (which is typically fixed), a sample rate conversion may be performed, e.g. from 48 kHz to 46.33 kHz (in the case of an external frame length of 1601.6 and an internal frame length of 1536).

Table 7 shows example external and internal frame lengths and their relation with the sequence index.

TABLE 7

| Frame Rate | Ext. Frame Length (Samples) | Sequence Index | Encoder Number of Input Samples | Remainder | Int. Frame Length (Samples) | Decoder Number of Output Samples | Remainder |
|---|---|---|---|---|---|---|---|
| 29.97 | 1601.6 | 0 | 1602 | 0.4 | 1536 | 1601 | 0.6 |
|  |  | 1 | 1602 | 0.8 | 1536 | 1602 | 0.2 |
|  |  | 2 | 1601 | 0.2 | 1536 | 1601 | 0.8 |
|  |  | 3 | 1602 | 0.6 | 1536 | 1602 | 0.4 |
|  |  | 4 | 1601 | 0 | 1536 | 1602 | 0 |
| 59.94 | 800.8 | 0 | 801 | 0.2 | 768 | 800 | 0.8 |
|  |  | 1 | 801 | 0.4 | 768 | 801 | 0.6 |
|  |  | 2 | 801 | 0.6 | 768 | 801 | 0.4 |
|  |  | 3 | 801 | 0.8 | 768 | 801 | 0.2 |
|  |  | 4 | 800 | 0 | 768 | 801 | 0 |
| 119.88 | 400.4 | 0 | 401 | 0.6 | 384 | 400 | 0.4 |
|  |  | 1 | 400 | 0.2 | 384 | 400 | 0.8 |
|  |  | 2 | 401 | 0.8 | 384 | 401 | 0.2 |
|  |  | 3 | 400 | 0.4 | 384 | 400 | 0.6 |
|  |  | 4 | 400 | 0 | 384 | 401 | 0 |

From Table 7 it can be seen that the fractional frame length of 1601.6 samples can be implemented using a subsequence of Z=5 frames, with a suite of individual frame lengths 1601, 1602, 1601, 1602, and 1602. The subsequence of frame lengths may be repeated within the bitstream 610 in order to provide a bitstream 610 which exhibits the fractional frame length 1601.6.

The decoding system may be configured to take into account the value of the sequence index for decoding, notably at a splicing point. In particular, the decoding system may be configured to determine the value of the sequence index of the frame 611 from the first sequence of frames, which is directly preceding a splicing point, based on the value $q_1$ of the sequence counter 612 of the frame 611. The value $i_1$ of the sequence index of the frame 611 may be determined using the above mentioned formula, i.e. $i_1 = q_1$ mod Z. The value $i_1$ of the sequence index of the frame 611 of the first sequence of frames may be indicative of the phase of the bitstream 610 prior to the splicing point.

In order to ensure a pre-determined fractional frame length for the entire bitstream 610, the decoding system may be locked to the phase of the bitstream 610 at the splicing point. In particular, the decoding system may be configured to set the value $i_2$ of the sequence index of the frame 612 of the second sequence of frames, which directly succeeds the splicing point, to $i_2 = (i_1+1)$ mod Z. In more general terms, the value $i_2$ of the sequence index of the frame 612 subsequent to a splicing point may be determined based on the value $i_1$ of the sequence index of the directly preceding frame 611 (which precedes the splicing point).

As can be seen in Table 7, depending on the value of the sequence index of a frame 611, there is a particular remainder, wherein the remainder of frame 611 corresponds to the difference between the number of samples which have been decoded (or encoded) subsequent to the decoding (or encoding) of frame 611 and the number of samples which should have been decoded (or encoded) in view of the fractional average frame length. Hence, the value $i_1$ of the sequence index of the frame 611 is indicative of such a remainder. The value $i_2$ of the sequence index of the frame 612 may be determined based on the remainder which is associated with the value $i_1$ of the sequence index of the frame 611.

As can also be seen from Table 2, the values of the sequence index are associated with different remainder values for different frame rates. In other words, the remainder values for different frame rates are ordered differently. Notably in case of a change of the frame rate between frames 611 and 612, the value $i_2$ of the sequence index of the frame 612 may be determined by determining the value $r_1$ of the remainder which is associated with the value $i_1$ of the sequence index of the frame 611 (at the first frame rate);

determining the pseudo value $\hat{i}_1$ of the sequence index which corresponds to the value $r_1$ of the remainder at the second frame rate; and determining the value $i_2$ of the sequence index of the frame 612 as $i_2 = (\hat{i}_1+1)$ mod Z.

By doing this, the phase of the bitstream 310 may be maintained at a splicing point and/or in case of a change of the frame rate. Table 8 shows values of the sequence index in case of example frame rate ratios. The frame rate change occurs between the "previous" frame 611 and the "next" frame 621.

TABLE 8

| Frame Rate Ratio (K/N) |  | ¼ | ½ | 2 | 4 |
|---|---|---|---|---|---|
| Frame | previous | next | | | |
| Sequence Index | 0 | 4 | 3 | 2 | 4 |
|  | 1 | 3 | 1 | 4 | 3 |
|  | 2 | 2 | 4 | 1 | 2 |
|  | 3 | 1 | 2 | 3 | 1 |
|  | 4 | 0 | 0 | 0 | 0 |

The locking of the phase is also applicable to the case where a pre-determined counter value (e.g. the counter value "0") is used to indicate the presence of a splicing point. A sequence counter value "0" may denote a so-called indicated splice, which is used to signal to the decoding system that a splice has occurred. The associated slice may be a controlled or an uncontrolled splice and hence may be seamless. The value of the sequence index of a frame 621 with a sequence counter of value "0" may be derived from the previous frame.

In case the frame rate remains unchanged at the splicing point, the value of the sequence index may be continued, i.e. $i_2 = (i_1+1)$ mod Z. In case the frame rate changes, the value of the sequence index of the frame 621 may be determined as outlined above, e.g. using the formula $i_2 = (\hat{i}_1+1)$ mod Z and/or using Table 8.

If the frame with the sequence counter value of 0 is the first frame in a decoding system, then the sequence counter value may be assumed to be $Q_{max}$, or—in other words—the value of the sequence index may be assumed to be 0.

In general, the value of the sequence counter of a frame n may be determined as $$\text{sequence\_counter} = ((n-1) \bmod 1020) + 1; \; n \in \mathbb{N}*.$$

The methods and systems described in the present document may be implemented as software, firmware and/or hardware. Certain components may e.g. be implemented as software running on a digital signal processor or microprocessor. Other components may e.g. be implemented as hardware and or as application specific integrated circuits. The signals encountered in the described methods and systems may be stored on media such as random access memory or optical storage media. They may be transferred via networks, such as radio networks, satellite networks, wireless networks or wireline networks, e.g. the Internet. Typical devices making use of the methods and systems described in the present document are portable electronic devices or other consumer equipment which are used to store and/or render audio signals.

The invention claimed is:

1. An audio signal processing device for resampling an input audio signal into an output audio signal, the audio signal processing device comprising:
   a processing unit configured to determine a current output sample of the output audio signal from one or more input samples of the input audio signal using a current subset of filter coefficients from a filter configured to reduce imaging and/or aliasing of the output audio signal; wherein the current subset of filter coefficients corresponds to a phase of a polyphase structure of the filter; and
   one or more memory units storing one or more look-up tables providing a mapping between phase indexes of different phases of the polyphase structure of the filter, which are to be used to determine different output samples, and phase indexes of directly preceding phases which are to be used to determine directly preceding output samples, respectively; and providing a mapping between phase indexes and respective subsets of filter coefficients from the filter;
   wherein the processing unit is configured to determine the current subset of filter coefficients based on a previous phase index for a previous output sample directly preceding the current output sample, using the one or more look-up tables;
   wherein one or more of the processing unit and the one or more memory units are implemented, at least in part, as one or more hardware elements of the audio signal processing device.

2. The audio signal processing device of claim 1, wherein:
   the audio signal processing device comprises a phase look-up table providing the mapping between phase indexes of different phases of the polyphase structure of the filter, which are to be used to determine different output samples, and phase indexes of directly preceding phases which are to be used to determine directly preceding output samples, respectively;
   the audio signal processing device comprises a filter look-up table providing the mapping between phase indexes and respective subsets of filter coefficients from the filter;
   the processing unit is configured to determine the current phase index based on the previous phase index for the previous output sample directly preceding the current output sample, using the phase look-up table; and
   the processing unit is configured to determine the current subset of filter coefficients based on the current phase index using the filter look-up table.

3. The audio signal processing device of claim 2, wherein:
   the audio signal processing device is configured to resample the input audio signal in accordance to an upsampling factor L, with L being greater than one;
   the polyphase structure comprises L phases; and
   the phase look-up table provides for each of L phase indexes for the L phases a mapping to the phase index for the directly preceding phase.

4. The audio signal processing device of claim 1, wherein the audio signal processing device is configured to resample the input audio signal in accordance to a downsampling factor M, with M being greater than one.

5. The audio signal processing device of claim 3, wherein:
   the filter comprises a total set of N filter coefficients; and
   the subsets of filter coefficients from the filter comprise N/L filter coefficients each.

6. The audio signal processing device of claim 2, wherein the phase look-up table is indicative of a sequence of phase indexes to be used to determine a corresponding sequence of output samples of the output audio signal.

7. The audio signal processing device of claim 6, wherein the processing unit is configured to determine the sequence of phase indexes and/or the phase look-up table based on the upsampling factor L and/or on the downsampling factor M.

8. The audio signal processing device of claim 7, wherein the processing unit is configured to:
   determine a base vector comprising a sequence of ascending integers from 1 to L;
   determine a concatenated vector from the base vector by concatenating the base vector M times; and
   determine the sequence of phase indexes by selecting every $M^{th}$ entry from the concatenated vector.

9. The audio signal processing device of claim 8, wherein the processing unit is configured to:
   select a first phase index from the sequence of phase indexes;
   increase the first phase index by L or multiples of L, as long as the increased first phase index is smaller or equal to M; and
   determine a second phase index which directly follows the first phase index in the sequence of phase indexes based on the increased first phase index.

10. The audio signal processing device of claim 9, wherein the processing unit is configured to determine the second phase index by subtracting M from the increased first phase index M, to yield an intermediate phase index.

11. The audio signal processing device of claim 10, wherein the processing unit is configured to determine the second phase index by subtracting the intermediate phase index from L+1.

12. The audio signal processing device of claim 7, wherein the processing unit is configured to determine the sequence of phase indexes by determining a difference between adjacent phase indexes from the sequence of phase indexes, wherein the difference $\Delta = M \bmod L$, for one or more pairs of adjacent phase indexes.

13. The audio signal processing device of claim 2, wherein:
   the audio signal processing device is configured to perform resampling in accordance to different upsampling factors L and/or in accordance to different downsampling factors M;

the phase look-up table comprises a plurality of phase index-to-phase index mappings for a plurality of different resampling ratios L/M, respectively; and the filter look-up table comprises a plurality of phase index-to-subset of filter coefficients mappings for the plurality of different resampling ratios L/M, respectively.

14. The audio signal processing device of claim 1, wherein the subsets of filter coefficients for the different phases of the polyphase structure are mutually exclusive with respect to one another.

15. The audio signal processing device of claim 1, wherein:

the audio signal processing device comprises a combined phase/filter look-up table providing a mapping between phase indexes and respective subsets of filter coefficients from the filter;

the phase indexes of the combined phase/filter look-up table are ordered in accordance to a sequence of phase indexes to be used to determine a corresponding sequence of output samples of the output audio signal.

16. The audio signal processing device of claim 15, wherein:

the audio signal processing device is configured to resample the input audio signal in accordance to an upsampling factor L, with L being greater than one; and the processing unit is configured to determine the current subset of filter coefficients based on the previous phase index for the previous output sample directly preceding the current output sample, using a MODULO L pointer into the combined phase/filter look-up table.

17. A method, performed by an audio signal processing device, for determining a sequence of phase indexes identifying a corresponding sequence of phases of a polyphase structure of a resampling filter used for determining a sequence of output samples of a resampled audio signal from a sequence of input samples of an input audio signal, the method comprising:

selecting a first phase index from the sequence of phase indexes;

increasing the first phase index by an upsampling factor L or by multiples of L, as long as the increased first phase index is smaller or equal to a downsampling factor M; and determining a second phase index which directly follows the first phase index in the sequence of phase indexes based on the increased first phase index;

wherein one or more of selecting a first phase index, increasing the first phase index, and determining a second phase index are implemented, at least in part, by one or more hardware elements of the audio signal processing device.

18. The method of claim 17, further comprising determining the second phase index by subtracting M from the increased first phase index M, to yield an intermediate phase index.

19. The method of claim 18, further comprising determining the second phase index by subtracting the intermediate phase index from L+1.

20. A method, performed by an audio signal processing device, for determining a sequence of phase indexes identifying a corresponding sequence of phases of a polyphase structure of a resampling filter used for determining a sequence of output samples of a resampled audio signal from a sequence of input samples of an input audio signal, the method comprising:

determining a base vector comprising a sequence of ascending integers from 1 to an upsampling factor L;

determining a concatenated vector from the base vector by concatenating the base vector M times, wherein M is a downsampling factor; and determining the sequence of phase indexes by selecting every $M^{th}$ entry from the concatenated vector;

wherein one or more of determining a base vector, determining a concatenated vector, and determining the sequence of phase indexes are implemented, at least in part, by one or more hardware elements of the audio signal processing device.

* * * * *